(12) United States Patent
Lee et al.

(10) Patent No.: US 7,830,713 B2
(45) Date of Patent: Nov. 9, 2010

(54) BIT LINE GATE TRANSISTOR STRUCTURE FOR A MULTILEVEL, DUAL-SIDED NONVOLATILE MEMORY CELL NAND FLASH ARRAY

(75) Inventors: Peter Wung Lee, Saratoga, CA (US); Fu-Chang Hsu, San Jose, CA (US)

(73) Assignee: Aplus Flash Technology, Inc., San Jose, CA (US)

( * ) Notice: Subject to any disclaimer, the term of this patent is extended or adjusted under 35 U.S.C. 154(b) by 281 days.

(21) Appl. No.: 12/075,677

(22) Filed: Mar. 13, 2008

(65) Prior Publication Data

US 2008/0225594 A1 Sep. 18, 2008

Related U.S. Application Data

(60) Provisional application No. 60/918,116, filed on Mar. 14, 2007.

(51) Int. Cl.
G11C 11/34 (2006.01)
(52) U.S. Cl. ............................. 365/185.17; 365/185.29; 365/185.33
(58) Field of Classification Search ............ 365/185.17, 365/185.29, 185.33, 185.01, 185.12, 185.13, 365/185.18, 185.24, 185.26
See application file for complete search history.

(56) References Cited

U.S. PATENT DOCUMENTS

| 5,126,808 | A | * | 6/1992 | Montalvo et al. ...... 365/185.09 |
|---|---|---|---|---|
| 5,768,192 | A | | 6/1998 | Eitan |
| 5,812,454 | A | * | 9/1998 | Choi .................... 365/185.17 |
| 6,163,048 | A | | 12/2000 | Hirose et al. |
| 6,490,204 | B2 | | 12/2002 | Bloom et al. |
| 6,614,070 | B1 | | 9/2003 | Hirose et al. |
| 6,614,692 | B2 | | 9/2003 | Eliyahu et al. |
| 6,845,042 | B2 | * | 1/2005 | Ichige et al. ........... 365/185.17 |
| 6,937,521 | B2 | | 8/2005 | Avni et al. |

(Continued)

FOREIGN PATENT DOCUMENTS

WO PCT/US2008/003400 5/2008

OTHER PUBLICATIONS

Co-pending US Patent AP07-001, U.S. Appl. No. 60/903,731, filed Feb. 26, 2007, "Circuits and Algorithms for Simultaneous Programming and Reading Multiple-Level, Dual-Sided Cell in NAND, NOR, EEPROM and Combo Flash Arrays," assigned to the same assignee as the present invention.

(Continued)

*Primary Examiner*—Dang T Nguyen
(74) *Attorney, Agent, or Firm*—Saile Ackerman LLC; Stephen B. Ackerman; Billy Knowles

(57) ABSTRACT

A nonvolatile memory structure with pairs of serially connected select transistors connected to the top and optionally to the bottom of NAND series strings of groups of the dual-sided charge-trapping nonvolatile memory cells for controlling connection of the NAND series string to an associated bit line. A first of the serially connected select transistors has an implant to make a threshold voltage of the implanted first serially connected select transistor different from a non-implanted second serially connected select transistor. The pair of serially connected top select transistors is connected to a first of two associated bit lines. Optionally, the NAND nonvolatile memory strings further is connected a pair of serially connected bottom select transistors that is connected to the second associated bit line.

48 Claims, 13 Drawing Sheets

U.S. PATENT DOCUMENTS

| | | |
|---|---|---|
| 7,113,431 B1 | 9/2006 | Hamilton et al. |
| 7,116,577 B2 | 10/2006 | Eitan |
| 7,120,063 B1 | 10/2006 | Liu et al. |
| 7,123,532 B2 | 10/2006 | Lusky et al. |
| 7,136,304 B2 | 11/2006 | Cohen et al. |
| 7,151,293 B1 | 12/2006 | Shiraiwa et al. |
| 7,158,411 B2 | 1/2007 | Yeh et al. |
| 7,170,785 B2 | 1/2007 | Yeh |
| 7,187,030 B2 | 3/2007 | Chae et al. |
| 7,203,092 B2 | 4/2007 | Nazarian |
| 2006/0171209 A1 | 8/2006 | Sim et al. |
| 2006/0180847 A1 | 8/2006 | Park et al. |
| 2006/0245233 A1* | 11/2006 | Mikolajick et al. ........... 365/100 |
| 2007/0115723 A1* | 5/2007 | Chen et al. ............. 365/185.17 |

OTHER PUBLICATIONS

Co-pending US Patent AP07-002, U.S. Appl. No. 60/904,294, filed Feb. 28, 2007, "Circuits and Algorithms for Simultaneous Programming and Reading the Single-Poly, Multiple-Level, Dual-Sided Cell in NAND, NOR, EEPROM and Combo Flash Arrays," assigned to the same assignee as the present invention.

Co-pending US Patent AP07-001, U.S. Appl. No. 12/069,637, filed Feb. 12, 2008, "A Circuit and Method for Multiple-Level Programming, Reading, and Erasing Dual-Sided Nonvilatile Memory Cell," assigned to the same assignee as the present invention.

Co-pending US Patent AP07-002, U.S. Appl. No. 12/069,228, filed Feb. 8, 2008, "A Bit Line Structure for a Multilevel, Dual-Sided Nonvolatile Memory Cell Array," assigned to the same assignee as the present invention.

"Intel StrataFlash™ Memory Technology Overview," By Atwood et al., Intel Technology Journal Q4'97, pp. 1-8.

"NROM: A Novel Localized Trapping, 2-Bit Nonvolatile Memory Cell," by Eitan et al., IEEE Electron Device Letters, vol. 21, No. 11, Nov. 2000, pp. 543-545.

"A Dual-Mode NAND Flash Memory: 1-Gb Multilevel and High-Performance 512-Mb Single-Level Modes," by Cho et al., IEEE Journal of Solid-State Circuits, vol. 36, No. 11, Nov. 2001, pp. 1700-1706.

"A 146-mm squared 8-Gb Multi-Level NAND Flash Memory with 70-nm CMOS Technology," by Hara et al., IEEE Journal of Solid-State Circuits, vol. 41, No. 1, Jan. 2006, pp. 161-169.

* cited by examiner

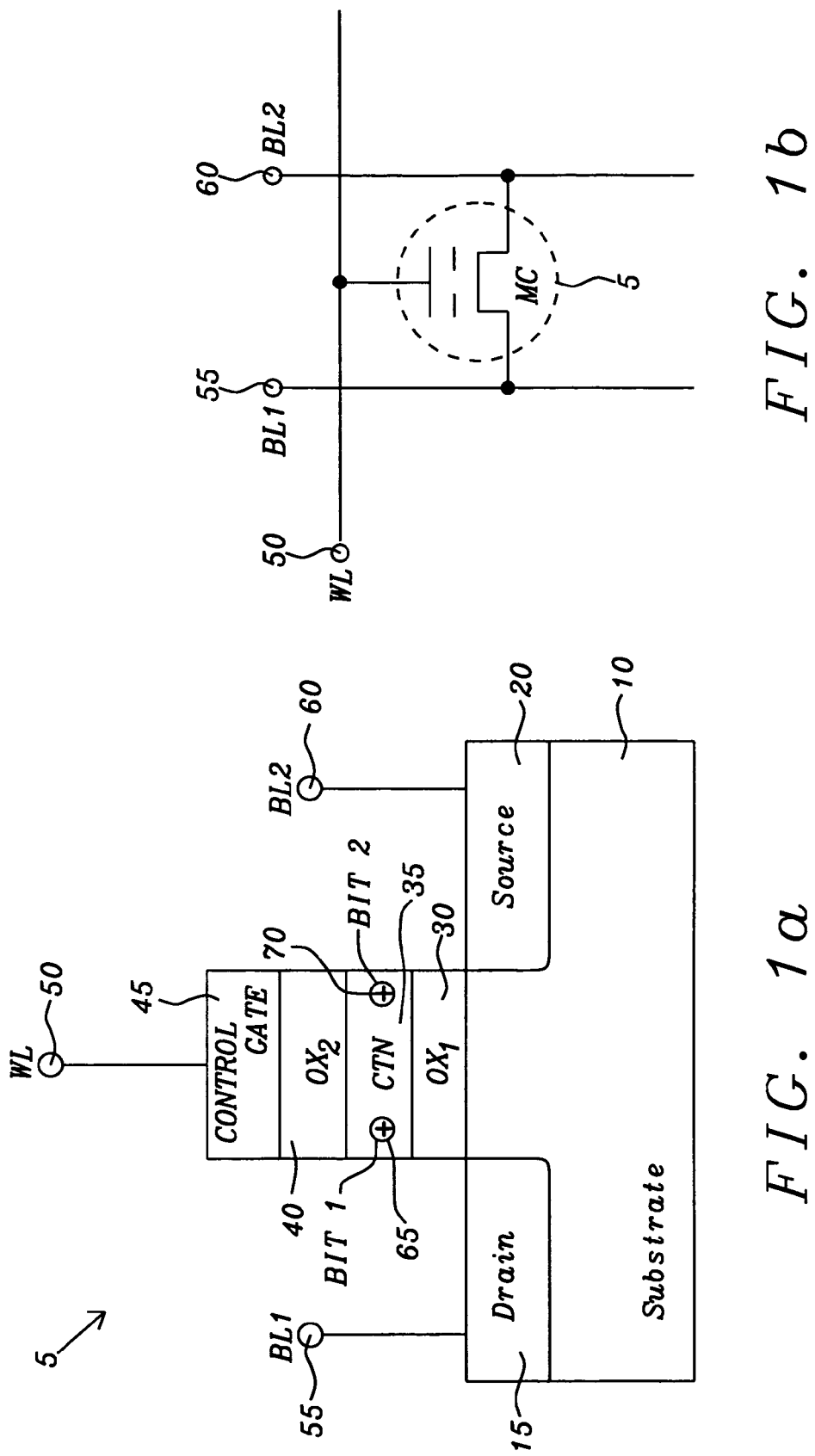

PROGRAM

|  | CELL1 | | CELL2 | |
| --- | --- | --- | --- | --- |
|  | 265a | 270a | 265b | 270b |
|  | VOLTAGE | VOLTAGE | VOLTAGE | VOLTAGE |
| GENERATOR | BIT 1 | BIT 2 | BIT 1 | BIT 2 |
| SC1a[SEL] | $V_{SG1}$ | $V_{SG2}$ | $V_{SG1}$ | $V_{SG2}$ |
| SC1b[SEL] | $V_{SG1}$ | $V_{SG2}$ | $V_{SG1}$ | $V_{SG2}$ |
| SC2[SEL] | $V_{SG2}$ | $V_{SG1}$ | $V_{SG2}$ | $V_{SG1}$ |
| VWL[SEL] | $V_{PGM}$ | $V_{PGM}$ | $V_{PGM}$ | $V_{PGM}$ |
| VWL[NSEL] | $V_{PASS}$ | $V_{PASS}$ | $V_{PASS}$ | $V_{PASS}$ |
| VBL[SEL] | $V_{BLn}/0$ | $V_{BLn}/0$ | $V_{BLn}/0$ | $V_{BLn}/0$ |
| VBL[NSEL] | $V_{BLn}/0$ | $V_{BLn}/0$ | $V_{BLn}/0$ | $V_{BLn}/0$ |

FIG. 10a

ERASE

| GENERATOR | VOLTAGE BIT 1 | VOLTAGE BIT 2 |
| --- | --- | --- |
| SC1[SEL] | $V_{SG1}$ | $V_{SG1}$ |
| SC1[NSEL] | $V_{SG1}$ | $V_{SG1}$ |
| VWL[SEL] | $V_{ERS}$ | $V_{ERS}$ |
| VWL[NSEL] | 0V | 0V |
| VBL[SEL] | $0/V_{INH}$ | $0/V_{INH}$ |
| VBL[NSEL] | $0/V_{INH}$ | $0/V_{INH}$ |

FIG. 10b

READ

| GENERATOR | VOLTAGE BIT 1 | VOLTAGE BIT 2 |
|---|---|---|
| SG1[SEL] | $V_{SG1}$ | $V_{SG2}$ |
| SG1[NSEL] | $V_{SG2}$ | $V_{SG1}$ |
| VWL[SEL] | $V_{READ}$ | $V_{READ}$ |
| VWL[NSEL] | $V_{PASS}$ | $V_{PASS}$ |
| VBL[SEL] | $V_{DRAIN}$ | 0 |
| VBL[NSEL] | 0 | $V_{DRAIN}$ |

FIG. 10c

PROGRAM

| | CELL1 205a | CELL2 205b |
|---|---|---|
| | VOLTAGE | VOLTAGE |
| WORD LINE CONTROL SIGNAL | SIMULTANEOUS BIT1 & BIT2 265a & 270a | SIMULTANEOUS BIT1 & BIT2 265b & 270b |
| SG1a[SEL] | $V_{SG1}$ | $V_{SG2}$ |
| SG1b[SEL] | $V_{SG2}$ | $V_{SG1}$ |
| SG2a[SEL] | $V_{SG1}$ | $V_{SG2}$ |
| SG2b[SEL] | $V_{SG2}$ | $V_{SG1}$ |
| VWL[SEL] | $V_{PGM}$ | $V_{PGM}$ |
| VWL[NSEL] | $V_{PASS}$ | $V_{PASS}$ |
| VBL[TOP] | $V_{BLn}/0$ | $V_{BLn}/0$ |
| VBL[BOT] | $V_{BLn}/0$ | $V_{BLn}/0$ |

FIG. 11

BIT LINE GATE TRANSISTOR STRUCTURE FOR A MULTILEVEL, DUAL-SIDED NONVOLATILE MEMORY CELL NAND FLASH ARRAY

This application claims priority under 35 U.S.C. §119 to U.S. Provisional Patent Application Ser. No. 60/918,116, filed on Mar. 14, 2007, which is herein incorporated by reference in its entirety.

BACKGROUND OF THE INVENTION

1. Related Patent Applications

U.S. Provisional Patent Application Ser. No. 60/903,731, filed on Feb. 26, 2007, which is herein incorporated by reference in its entirety.

U.S. Provisional Patent Application Ser. No. 60/904,294, filed on Feb. 28, 2007, which is herein incorporated by reference in its entirety.

U.S. patent application Ser. No. 12/069,228 filed on Feb. 8, 2008, assigned to the same assignee as the present invention, and incorporated herein by reference in its entirety.

U.S. patent application Ser. No. 12/069,637 filed on Feb. 12, 2008, assigned to the same assignee as the present invention, and incorporated herein by reference in its entirety.

2. Field of the Invention

This invention relates generally to nonvolatile memory array structures and operation. More particularly, this invention relates to bit line structures of dual-sided charge-trapping nonvolatile memory cells. Even more particularly, this invention relates to a gating structure for a NAND series string of dual-sided charge-trapping nonvolatile memory cells.

3. Description of Related Art

Nonvolatile memory is well known in the art. The different types of nonvolatile memory include Read-Only-Memory (ROM), Electrically Programmable Read Only Memory (EPROM), Electrically Erasable Programmable Read Only Memory (EEPROM), NOR Flash Memory, and NAND Flash Memory. In current applications such as personal digital assistants, cellular telephones, notebook and laptop computers, voice recorders, global positioning systems, etc., the Flash Memory has become one of the more popular types of Nonvolatile Memory. Flash Memory has the combined advantages of the high density, small silicon area, low cost and can be repeatedly programmed and erased with a single low-voltage power supply voltage source.

The Flash Memory structures known in the art employ a charge storage mechanism and a charge trapping mechanism. The charge storage regime, as with a floating gate nonvolatile memory, the charge represents digital data stored on a floating gate of the device. The stored charge modifies the threshold voltage of the floating gate memory cell determine that digital data stored. In a charge trapping regime, as in a Silicon-Oxide-Nitride-Oxide-Silicon (SONOS) or Metal-Oxide-Nitride-Oxide-Silicon (MONOS) type cell, the charge is trapped in a charge trapping layer between two insulating layers. The charge trapping layer in the SONOS/MONOS devices has a relatively high dielectric constant (k) such Silicon Nitride ($SiN_x$). The trapping structure of the charge trapping layer is such that it is possible to store two bits of data in a single SONOS/MONOS nonvolatile memory cell.

U.S. Pat. No. 5,768,192 (Eitan) illustrates a charge trapping non-volatile semiconductor memory cell utilizing asymmetrical charge trapping. The programmable read only memory (PROM) has a trapping dielectric sandwiched between two silicon dioxide layers The trapping dielectric are silicon oxide-silicon nitride-silicon oxide (ONO) and silicon dioxide with buried polysilicon islands. A nonconducting dielectric layer functions as an electrical charge trapping medium. This charge trapping layer is sandwiched between two layers of silicon dioxide acting as an electrical insulator. A conducting control gate layer is placed over the upper silicon dioxide layer. The memory device is programmed using hot hole programming, by applying programming voltages to the gate and the drain while the source is grounded. Hot holes are accelerated sufficiently to be injected into the region of the trapping dielectric layer near the drain. The device is read in the opposite direction from which it was written. The reading voltages are applied to the gate and the source while the drain is grounded. For the same applied gate voltage, reading in the reverse direction greatly reduces the potential across the trapped charge region. This permits much shorter programming times by amplifying the effect of the charge trapped in the localized trapping region.

U.S. Pat. No. 7,187,030 (Chae, et al.) describes a SONOS memory device, and a method for erasing data from the SONOS memory device. The erasing includes injecting charge carriers of a second sign into a trapping film, which has trapped charge carriers of a first sign to store data in the trapping film. The charge carriers of the second sign are generated by an electric field formed between one of a first and second electrodes contacting at least one bit line and a gate electrode contacting a word line. A blocking film may be provided between the gate electrode and the trapping film. The charge carriers of the second sign may be hot holes.

U.S. Pat. No. 7,170,785 (Yeh) illustrates a method and apparatus for operating a string of charge trapping memory cells. The string of memory cells with a charge trapping structure is read, by selecting part of a memory cell selected by a word line. Part of the memory cell is selected by turning on one of the pass transistors on either side of the string of memory cells. The charge storage state of the selected part is determined by measuring current in a bit line tied to both pass transistors.

U.S. Pat. No. 7,158,411 (Yeh, et al.) provides a memory architecture for an integrated circuit that includes a first memory array configured to store data for one pattern of data usage and a second memory array configured to store data for another pattern of data usage. The first and second memory arrays are formed of charge storage based nonvolatile memory cells.

U.S. Pat. No. 7,151,293 (Shiraiwa, et al.) describes SONOS memory with inversion bit-lines. The SONOS memory cell, formed within a semiconductor substrate, includes a bottom dielectric disposed on the semiconductor substrate, a charge trapping material disposed on the bottom dielectric, and a top dielectric disposed on the charge trapping material. Furthermore, the SONOS memory cell includes a word-line gate structure disposed on the top dielectric and at least one bit-line gate for inducing at least one inversion bit-line within the semiconductor substrate.

U.S. Pat. No. 7,120,063 (Liu, et al.) illustrates flash memory cells that include a dielectric material formed above a substrate channel region, a charge trapping material formed over the dielectric material, and a control gate formed over the charge trapping material. The cell may be programmed by directing electrons from the control gate into the charge trapping material to raise the cell threshold voltage. The electrons may be directed from the control gate to the charge trapping material by coupling a substrate to a substrate voltage potential, and coupling the control gate to a gate voltage potential, where the gate voltage potential is lower than the substrate voltage potential. The cell may be erased by directing electrons from the charge trapping material into the control gate to lower a threshold voltage of the flash memory cell, such as by coupling the substrate to a substrate voltage potential, and coupling the control gate to a gate voltage potential, where the gate voltage potential is higher than the substrate voltage potential.

The nonvolatile memory cells of the prior art are often configured as NAND cell structures. U.S. Pat. Nos. 6,614,070 and 6,163,048 (Hirose, et al.) describe a semiconductor nonvolatile memory device having a NAND cell structure. A NAND stack or string of nonvolatile memory cell transistors is placed within a well formed on a semiconductor substrate. The series string of nonvolatile memory cell transistors have threshold voltages that are electrically altered over a range of depletion values. When a cell within a certain NAND series string is selected for a read operation, a peripheral circuit drives selected gate word line to the well potential and drives the word lines of the other gates within the selected NAND stack to a potential at least equal in magnitude to the magnitude of the a reference voltage plus the threshold voltage of a memory cell in the programmed state.

"A 146-mm$^2$ 8-Gb Multi-Level NAND Flash Memory with 70-nm CMOS Technology", Hara, et al., IEEE Journal of Solid-State Circuits, January 2006, Vol.: 41, Issue: 1, pp.: 161-169 provides an 8-Gb multi-level NAND Flash memory with 4-level programmed cells.

"NROM: A Novel Localized Trapping, 2-Bit Nonvolatile Memory Cell", Eitan, et al., IEEE Electron Device Letters, November, 2000, Vol.: 21, Issue: 11, pp.: 543-545, presents a novel flash memory cell based on localized charge trapping in a dielectric layer. It is based on the storage of a nominal ~400 electrons above a n+/p junction. Programming is performed by channel hot electron injection and erase by tunneling enhanced hot hole injection. The read methodology is sensitive to the location of trapped charge above the source. This single device cell has a two physical bit storage capability.

"A Dual-Mode NAND Flash Memory: 1-Gb Multilevel and High-Performance 512-Mb Single-Level Modes", Cho et al. IEEE Journal of Solid-State Circuits, November, 2001, Vol.: 36, Issue: 11, pp.: 1700-1706, describes a 116.7-mm$^2$ NAND flash memory having two modes: a 1-Gb multilevel program mode (MLC) and a high-performance 512-Mb single-level program cell (SLC) modes. A two-step bit line setup scheme suppresses the peak current below 60 mA. A word line ramping technique avoids program disturbance. The SLC mode uses the 0.5-V incremental step pulse and self-boosting program inhibit scheme to achieve high program performance, and the MLC mode uses 0.15-V incremental step pulse and local self-boosting program inhibit scheme to tightly control the cell threshold voltage Vth distributions.

U.S. Pat. No. 7,203,092 (Nazarian) provides a memory array having rows and columns of flash memory cells. Each column of the memory cells is arranged as NAND series strings of memory cells. Each NAND series string having a top select transistor and a bottom select transistor. The top select transistor and the bottom select transistor are coupled to bit lines, such that alternate bit lines are operated either as source lines or bit lines in response to bit line selection and biasing.

The structure of a multiple bit programming of nonvolatile memory cells is known in the art as described in "Intel StrataFlash™ Memory Technology Overview", Atwood, et al., Intel Technology Journal, Vol. 1, Issue 2, Q4 1997, found www.intel.com, Apr. 23, 2007. The nonvolatile memory cells include a single transistor with an isolated floating gate. The flash cell is an analog storage device in that it stores charge (quantized at a single electron) not bits. By using a controlled programming technique, it is possible to place a precise amount of charge on the floating gate. The charge can be accurately placed to one of four charge states (or ranges) that describe two bits. Each of the four charge states is associated with a two-bit data pattern. The number of states required is equal to 2N where N is the desired number of bits. Threshold of the flash cells is then determined to read the digital data stored in the flash cell.

U.S. Pat. No. 7,113,431 (Hamilton, et al.) pertains to a technique for erasing bits in a dual bit memory in a manner that maintains complementary bit disturb control of bit-pairs of memory cells wherein each bit of the dual bit memory cell can be programmed to multiple levels. One exemplary method comprises providing a word of memory cells after an initial erasure and programming of the bits of the word to one or more of the higher program levels. A disturb level is determined for each of the bit-pairs of the word. A combined disturb level is then computed that is representative of the individual disturb levels. A pattern of drain voltages is then applied to the word for a number of program passes until a target pattern is stored in the word of memory cells based on the combined disturb level and the unprogrammed bit of the bit-pairs is erased to a single program level. This compensates for the disturbance level that exists between the complementary bit-pairs of the word, improves the threshold voltage (Vt) distribution at the program level of the erased state and thereby improves the accuracy of subsequent higher level programming operations and mitigates false or erroneous reads of the states of such program levels.

SUMMARY OF THE INVENTION

An object of this invention is to provide nonvolatile memory structure with a pair of gating transistors of a NAND string for controlling connection of the NAND series string to an associated bit line.

To accomplish at least this object, a nonvolatile memory array has a plurality of nonvolatile memory cells arranged in row and columns. Groups of the nonvolatile memory cells are serially connected to form NAND nonvolatile memory strings. Each column includes at least one of the NAND nonvolatile memory strings. Each of the NAND nonvolatile memory strings has a pair of serially connected top select transistors. Each of the pair of serially connected top select transistors has a first source/drain wherein the two first source/drains of the pair of serially connected top select transistors are connected together. A first of the serially connected top select transistors has an implant to make a threshold voltage of the implanted first serially connected top select transistor different from a non-implanted second serially connected top select transistor. A second source/drain of one top select transistor of the pair of serially connected top select transistors is connected to a top dual-sided charge-trapping nonvolatile memory cell of the NAND series string of dual-sided charge-trapping nonvolatile memory cells.

The nonvolatile memory array includes a plurality of bit lines, placed within the nonvolatile memory array such that each the bit lines is associated with at least one of the columns of the plurality of NAND nonvolatile memory strings and each of the columns of the plurality of NAND nonvolatile memory strings is associated with a pair of bit lines. A second source/drain of a top select transistor of the pair of serially connected top select transistors is connected to a first of the two bit lines associated with the NAND series string nonvolatile memory structure.

In one embodiment, each NAND nonvolatile memory string further includes a bottom select transistor having a first source/drain connected to a bottom dual-sided charge-trapping nonvolatile memory cell of the NAND series string of dual-sided charge-trapping nonvolatile memory cells and a second source/drain connected to a second of the two bit lines associated with the NAND series string nonvolatile memory structure.

In other embodiments, each NAND nonvolatile memory string further includes a pair of serially connected bottom select transistors. Each of the pair of serially connected bottom select transistors has a first source/drain connected together. A first of the serially connected bottom select transistors has an implant to make a threshold voltage of the implanted first serially connected select transistor different from the other non-implanted serially connected bottom select transistor. A second source/drain of one of the serially connected transistors is connected to a bottom dual-sided charge-trapping nonvolatile memory cell of the NAND series string of dual-sided charge-trapping nonvolatile memory cells.

Both of the pair of serially connected top select transistors are turned on only when a first select voltage applied to a gate of the one implanted transistor of the pair of serially connected top select transistors and a second select voltage applied to a gate of other non-implanted transistor of the serially connected top select transistors are greater than the threshold voltages pair of serially connected top select transistors. When both of the pair of serially connected top select transistors are turned on, the top dual-sided charge-trapping nonvolatile memory cell is connected to the first of two bit lines associated with the NAND series string nonvolatile memory structure.

Both of the pair of serially connected bottom select transistors are turned on only when a first select voltage applied to a gate of the one implanted transistor of the pair of serially connected bottom select transistors and a second select voltage applied to a gate of other non-implanted pair of serially connected bottom select transistors are greater than the threshold voltages pair of serially connected bottom select transistors. When both of the pair of serially connected bottom select transistors are turned on, the bottom dual-sided charge-trapping nonvolatile memory cell is connected to the second of two bit lines associated with the NAND series string nonvolatile memory structure.

The implant may be an acceptor impurity and thus adjusts the threshold voltage of the implanted one serially connected top select transistor to a larger positive voltage. The acceptor impurity may be boron and the larger positive voltage is approximately +4.0V.

Alternately, the implant may be a donor impurity and adjusts the threshold voltage of the implanted one serially connected top select transistor to a larger negative voltage. The donor impurity may be phosphorus and the larger negative voltage is approximately −4.0V.

BRIEF DESCRIPTION OF THE DRAWINGS

FIGS. 1a and 1b are respectively a cross sectional view of and a schematic symbol for a dual-sided charge-trapping nonvolatile memory cell.

FIGS. 10a, 10b, and 10c are tables of the voltages respectively necessary for programming, erasing, and reading the array of a first embodiment of multilevel programmed dual-sided nonvolatile memory cell structure of this invention.

FIG. 11 is a table of the voltages respectively necessary for programming, the array of a second embodiment of multilevel programmed dual-sided nonvolatile memory cell structure of this invention.

DETAILED DESCRIPTION OF THE INVENTION

Figure 1C:
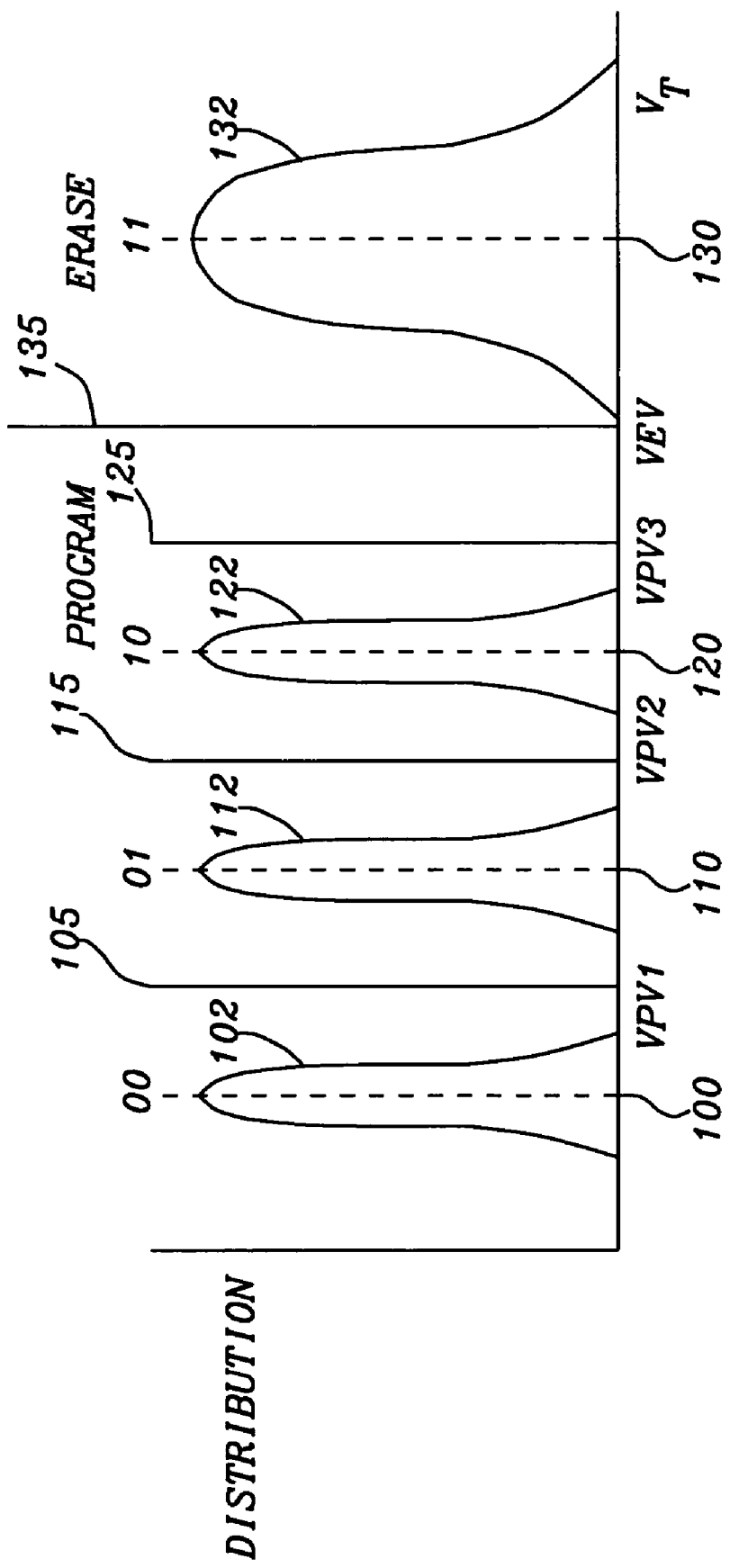
FIG. 1c is a plot of the threshold voltage ($V_t$) for programming each memory cell of an array of dual-sided charge-trapping nonvolatile memory cells versus the number of dual-sided charge-trapping nonvolatile memory cells having a specific threshold voltage for a multiple bit programming by a programming circuit of the control apparatus of this invention.

A nonvolatile memory array of this invention is formed of dual-sided charge-trapping nonvolatile memory cells that are arranged in rows and columns. Groupings of dual-sided charge-trapping nonvolatile memory cells on each column are arranged in a NAND series strings. Each NAND series string has a pair of serially connected top select transistors connected in series with each of the groupings of the dual-sided charge-trapping nonvolatile memory cells. Each of the pair of serially connected top select transistors has a first source/drain connected such that the two first source/drains of the pair of serially connected top select transistors are jointly connected together. One of the serially connected top select transistors has an implant to make a threshold voltage of the implanted first serially connected top select transistor different from a non-implanted second serially connected top select transistor. A second source/drain of either top select transistor of the pair of serially connected top select transistors is connected to a top dual-sided charge-trapping nonvolatile memory cell of the NAND series string of dual-sided charge-trapping nonvolatile memory cells.

In one embodiment each of the NAND series strings has a bottom dual-sided charge-trapping nonvolatile memory cell connected to a first source/drain one bottom select transistor. A second source/drain of the bottom select transistor is connected to a second of the two bit lines associated with the NAND series string structure. In another embodiment, each NAND series string has a pair of serially connected bottom select transistors connected in series with each of the groupings of the dual-sided charge-trapping nonvolatile memory cells. Each of the pair of serially connected bottom select transistors has a first source/drain connected such that the two first source/drains of the pair of serially connected bottom select transistors are jointly connected together. One of the serially connected bottom select transistors has an implant to make a threshold voltage of the implanted first serially connected bottom select transistor different from a non-implanted second serially connected bottom select transistor. A second source/drain of either bottom select transistor of the pair of serially connected bottom select transistors is connected to a bottom dual-sided charge-trapping nonvolatile memory cell of the NAND series string of dual-sided charge-trapping nonvolatile memory cells.

Both of the pair of serially connected top select transistors are turned on only when a first select voltage applied to a gate of the one implanted transistor of the pair of serially connected top select transistors and a second select voltage applied to a gate of the other non-implanted pair of serially connected top select transistors are greater than the threshold voltages of the pair of serially connected top select transistors to connect the top dual-sided charge-trapping nonvolatile memory cell to the first of two bit lines with the NAND series string. Similarly, both of the pair of serially connected bottom select transistors are turned on only when a first select voltage applied to a gate of the one implanted transistor of the pair of serially connected bottom select transistors and a second select voltage applied to a gate of the other non-implanted pair of serially connected bottom select transistors are greater than the threshold voltages of the pair of serially connected bottom select transistors to connect the bottom dual-sided charge-trapping nonvolatile memory cell to the first of two bit lines with the NAND series string.

Each column of the dual-sided charge-trapping nonvolatile memory cells is associated with a pair of bit lines. A second source/drain of the pair of serially connected top select transistors that is not connected to the top dual-sided charge-trapping nonvolatile memory cell of the NAND series string is connected to one of the pair of bit lines associated with the column NAND series string nonvolatile memory cells. Similarly, a second source/drain of the pair of serially connected bottom select transistors that is not connected to the bottom dual-sided charge-trapping nonvolatile memory cell of the NAND series string is connected to the other of the pair of bit lines associated with the column NAND series string nonvolatile memory cells.

Those bit lines that are not on the periphery of the array are associated with the columns of dual-sided charge-trapping nonvolatile memory cells that are adjacent to the two sides of the bit lines. Those bit lines at the periphery of the array are associated only with the single adjacent columns of dual-sided charge-trapping nonvolatile memory cells. The top select transistors of the pairs of serially connected top select transistors of each of the NAND series string structures for adjacent columns may be connected to the mutually associated bit line. Similarly, the bottom select transistors of the pairs of serially connected bottom select transistors of each of the NAND series string structures for adjacent columns may be connected to the mutually associated bit line. Alternately, the top select transistor of the pair of serially connected top select transistors of one of the NAND series string structures for one of the adjacent columns and the bottom select transistor of the pair of serially connected bottom select transistors of the other of the NAND series string structures for other of the adjacent columns may be connected to the mutually associated bit line.

A bit line controller is connected to the plurality of bit lines to transfer bit line operational voltages to selected dual-sided charge-trapping nonvolatile memory cells for programming, reading, and erasing trapped charges representing multiple digital data bits within a charge trapping region of each of the selected dual-sided charge-trapping nonvolatile memory cells.

The control gate of each of the dual-sided charge-trapping nonvolatile memory cells on each row of the nonvolatile memory array of this invention is connected to a word line. Each gate of pair of serially connected top select transistors of the NAND series strings of the dual-sided charge-trapping nonvolatile memory cells is connected to a pair top select lines. Similarly, each gate of the pair of serially connected bottom select transistors of the NAND series strings of the dual-sided charge-trapping nonvolatile memory cells is connected to a pair of bottom select lines. A word line controller is connected to the word lines, the pairs top select lines, and the pairs of bottom select lines to transfer word line operational voltages for selecting, programming, reading, and erasing the trapped charges representing the multiple digital data bits within the charge trapping region of each of the selected dual-sided charge-trapping nonvolatile memory cells.

Refer now to FIGS. 1*a* and 1*b* for a discussion Silicon-Oxide-Nitride-Oxide-Silicon (SONOS) or Metal-Oxide-Nitride-Oxide-Silicon (MONOS) dual-sided flash memory cell structure in FIG. 1*a* and the schematic symbol in FIG. 1*b* for the nonvolatile memory array of this invention. The dual-sided charge-trapping nonvolatile memory cell 5 is formed within a substrate 10. A drain region 15 and source region 20 are formed within the substrate 10. A relatively thin gate oxide or tunneling oxide 30 is deposited on the substrate 10. A charge trapping layer 35 is then formed over the oxide layer 30 above the channel region 25 between drain region 15 and source region 20. A second dielectric oxide layer 40 is placed on top of charge trapping layer 35 to separate the charge trapping layer 35 from a poly-crystalline silicon layer 45. The poly-crystalline silicon layer 45 forms the control gate of the dual-sided charge-trapping nonvolatile memory cell 5. The control gate 45 of the dual-sided charge-trapping nonvolatile memory cell 5, when placed in an array of dual-sided charge-trapping nonvolatile memory cells 5, is connected to a word line terminal 50. The drain 15 is connected to a first bit line terminal 55 and the source 20 is connected to a second bit line terminal 55. The dual-sided flash memory cell stores the digital data bits as trapped charge within the charge trapping layer 35 above the channel 25 that is formed between drain 15 and source 20.

The operation of the multilevel dual-sided flash memory cell 5 consists of an erase operation, a program operation, and a read operation. In the erase operation, the word line terminal 50 is set to a very large erasing voltage that is applied to the control gate 45 to inject the electrons into the trapped charges 65 and 70 from the channel region between drain region 15 and source region 20. The first and second bit line terminals 55 and 60 and thus the drain 15 and source 20 are set to ground reference level. The program operation of the multilevel dual-sided flash memory cell 5 begins by setting the word line terminal 50 to a medium large programming voltage that is applied to the control gate 45. The medium large programming voltage has an opposite polarity of the very large erasing voltage. For programming the charge trapping region 65 nearest the drain region 15, the first bit line terminal 55 and thus the drain 15 is set to the bit line voltage level and the second bit line terminal 60 and thus the source 20 is set to the ground reference voltage. For programming the charge trapping region 70 nearest the source region 20, the second bit line terminal 60 and thus the source 20 is set to the bit line voltage level and the first bit line terminal 55 and thus the drain 15 is set to the ground reference voltage. The read operation begins by setting the word line terminal 50 and thus the control gate 45 to a read voltage level. To read the program state of the charge trapping region 65, the first bit line terminal 55 and thus the drain region 15 is set to the ground reference voltage and the second bit line terminal 60 and thus the source region 20 is set to the drain read voltage level. The threshold voltage (Vt) as adjusted by the charge level of the charge trapping region 65 determines the digital data stored in the charge trapping region 65. To read the program state of the charge trapping region 70, the first bit line terminal 55 and thus the drain region 15 is set to the drain read voltage level and the second bit line terminal 60 and thus the source region 20 is set to the ground reference voltage. The threshold voltage (Vt) as adjusted by the charge level of the charge trapping region 70 determines the digital data stored in the charge trapping region 70.

The method of operation of this invention for a SONOS/MONOS dual-sided flash memory cell provides multiple bits being stored in each of the charge trapping regions 65 and 70 of FIG. 1a. In FIG. 1c, each of the charge trapping regions may have one of four levels 100, 110, 120, and 130 and thus represent two binary bits of the digital data. The threshold voltage level 130 being the erased voltage level as well as the voltage level for the digital data for a digital 11. An array of the SONOS/MONOS dual-sided flash memory cells will be programmed sufficiently long such that the distribution of the threshold voltages (Vt) 102, 112, 122, and 132 allow the setting of the word line voltage and thus the control gates of the array to the program voltages VPV1 105, VPV2 115, and VPV3 125. During a read operation the control gate is set at each voltage level to determine the threshold voltage Vt representing the two bits of the digital data stored in each of the charge trapping layers.

Figure 2:
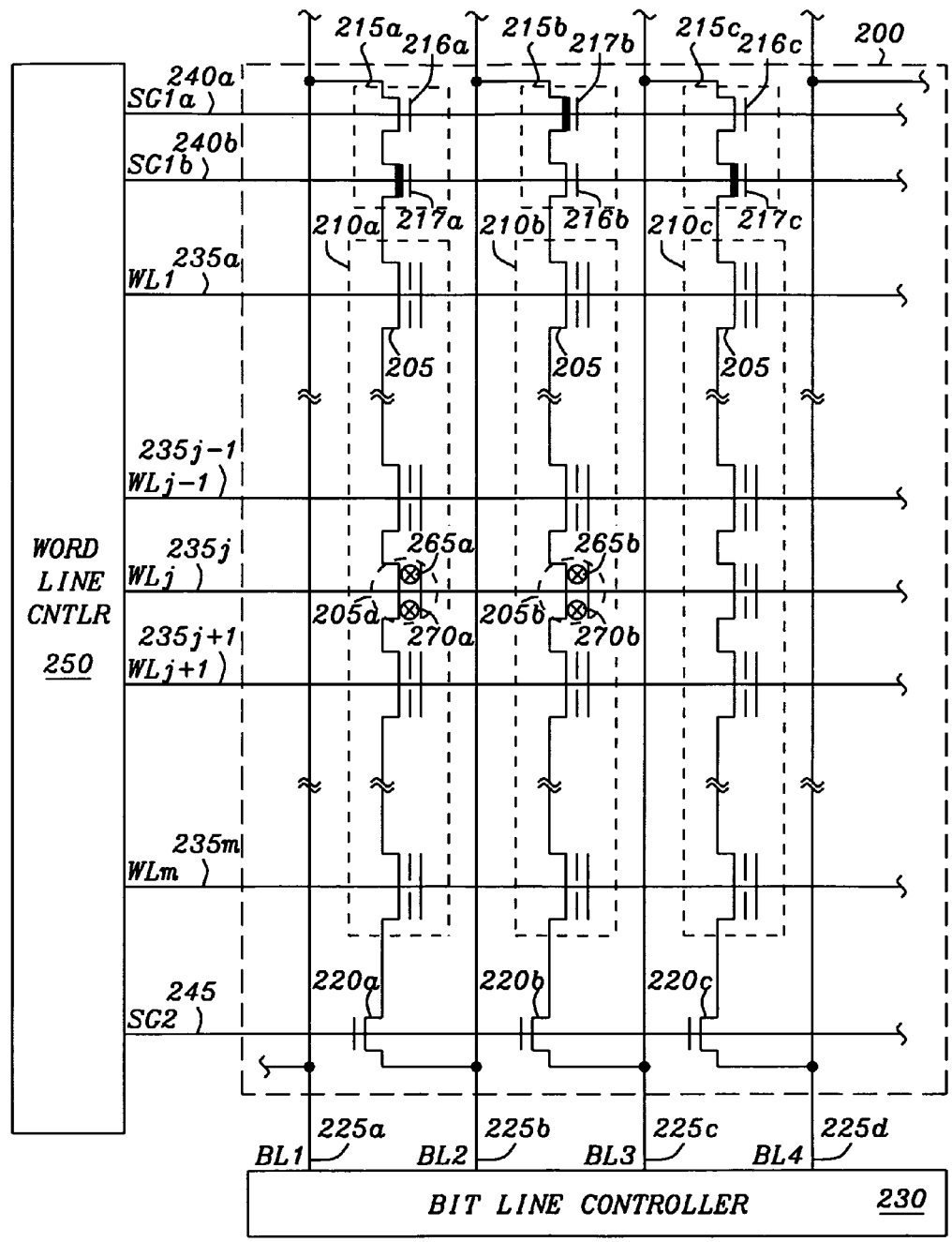
FIG. 2 is a schematic diagram of a first embodiment of an array of multilevel programmed dual-sided nonvolatile memory structures with a pair of serially connected top select transistors of this invention.

The nonvolatile memory array 200 of one embodiment is formed of dual-sided charge-trapping nonvolatile memory cells of FIG. 1a that are arranged in rows and columns, as illustrated in FIG. 2. Groupings 210a, 210b, and 210c of the dual-sided charge-trapping nonvolatile memory cells 205 resident on each column of the nonvolatile memory array 200 are connected to form NAND series strings of the dual-sided charge-trapping nonvolatile memory cells 205. Each of the NAND series string groupings 210a, 210b, and 210c have pairs of serially connected top select transistors 215a, 215b, and 215c and bottom select transistors 220a, 220b, and 220c connected in series with each of the NAND series string groupings 210a, 210b, and 210c. Each transistor 216a, 216b, and 216c and 217a, 217b, and 217c of the respective pairs of serially connected top select transistors 215a, 215b, and 215c has a first source/drain connected such that the two first source/drains of the pairs of serially connected top select transistors 215a, 215b, and 215c are jointly connected together. One of the serially connected top select transistors 217a, 217b, and 217c has an implant to make a threshold voltage of the implanted serially connected top select transistor 217a, 217b, and 217c different from a non-implanted second serially connected top select transistor 216a, 216b, and 216c. A second source/drain of either top select transistor 217a, 216b, and 217c of the pairs of serially connected top select transistors 215a, 215b, and 215c is connected to a top dual-sided charge-trapping nonvolatile memory cell of the NAND series string groupings 210a, 210b, and 210c. It should be noted that the order of the implanted serially connected top select transistors 217a, 217b, and 217c and the non-implanted second serially connected top select transistors 216a, 216b, and 216c alternates between adjacent columns of the nonvolatile memory array 200. Further, it should be noted that the sequence order of which of the implanted serially connected top select transistors 217a, 217b, and 217c or the non-implanted second serially connected top select transistors 216a, 216b, and 216c is located on a first of the columns of the nonvolatile memory array 200.

Each bottom select transistor 220a, 220b, and 220c has a first source/drain connected to the source of the bottom dual-sided charge-trapping nonvolatile memory cell 205 of their respective NAND series string groupings 210a, 210b, and 210c. The sources and drains of the implanted serially connected top select transistors 217a, 217b, and 217c and the non-implanted second serially connected top select transistors 216a, 216b, and 216c and the bottom select transistor 220a, 220b, and 220c are interchangeable in function and therefore are designated first and second source/drains for clarity.

A second source/drain of the top select transistors 216a, 217b, and 216c of the pairs of serially connected top select transistors 215a, 215b, and 215c are connected to a first of the associated pair of bit lines 225a, 225b, and 225c. A second source/drain of the bottom select transistor 220a, 220b, 220c are connected to a second of the associated pair of bit lines 225b, 225c, and 225d.

Each column (in this implementation as shown, one of the NAND series string groupings 210a, 210b, and 210c) of the nonvolatile memory array 200 of this invention is respectively associated with a pair of bit lines 225a and 225b, 225b and 225c, 225c and 225d. Thus each of the bit lines 225a, 225b, 225c, 225d is further associated with a first adjacent column 210a, 210b, 210c of dual-sided charge-trapping nonvolatile memory cells. Thus each of the bit lines 225a, 225b, 225c, and 225d with the exception of the bit lines 225a and 225d that are adjacent to the columns at the periphery of the nonvolatile memory array 200 are associated with two columns of the nonvolatile memory array 200. The two bit lines 225a and 225d as peripheral bit lines are associated with only one of the columns of the nonvolatile memory array 200.

A second source/drain of the top select transistor of the pairs of serially connected top select transistors 215a, 215b, and 215c of the first adjacent column 210a, 210b, 210c is connected to the second of the associated pair of bit lines 225a, 225b, 225c, and 225d and a source/drain of the bottom select transistor of the second adjacent column is connected to the first of the associated pair of bit lines 225a, 225b, 225c, and 225d. Having the top select transistor of the pairs of serially connected top select transistors 215a, 215b, and 215c of one column 210a, 210b, 210c and the bottom select transistor of an adjacent column 210a, 210b, 210c connected to the bit line 225a, 225b, 225c, and 225d of the associated pair of bit lines 225a, 225b, 225c, and 225d provides a cross connective columnar bit line structure.

All of the bit lines 225a, 225b, 225c, and 225d are connected to the bit line controller 230. The bit line controller 230 provides the necessary bit line operational voltages to selected dual-sided charge-trapping nonvolatile memory cells 205 for programming, reading, and erasing trapped charges representing multiple digital data bits within a charge trapping region of each of the selected dual-sided charge-trapping nonvolatile memory cells.

A control gate of each of the dual-sided charge-trapping nonvolatile memory cells 205 on each row of the nonvolatile memory array 200 of this invention is connected to one word line 235a, 235b, 235j−1, 235j, 235j+1, and 235m. The gates of the pairs of serially connected top select transistors 215a, 215b, and 215c are connected to the top select gate lines 240a and 240b. The gates of the top select transistors 216a, 217b, and 216c of the pairs of serially connected top select transistors 215a, 215b, and 215c are connected to the top select gate lines 240a and the gates of the second select transistors 217a, 216b, and 217c of the pairs of serially connected top select transistors 215a, 215b, and 215c are connected to the top select gate lines 240b. The gates of the bottom select transistors 220a, 220b, and 220c are connected to the bottom select gate line 245. All of the word lines 235a, 235b, 235j−1, 235j, 235j+1, and 235m, top select gate lines 240a and 240b, and the bottom select gate line 245 are connected to a word line controller 250. The word line controller 250 transfers word line operational voltages for selecting, programming, reading, and erasing the trapped charges representing the multiple digital data bits within the charge trapping region of each of the selected dual-sided charge-trapping nonvolatile memory cells 205.

Figure 3:
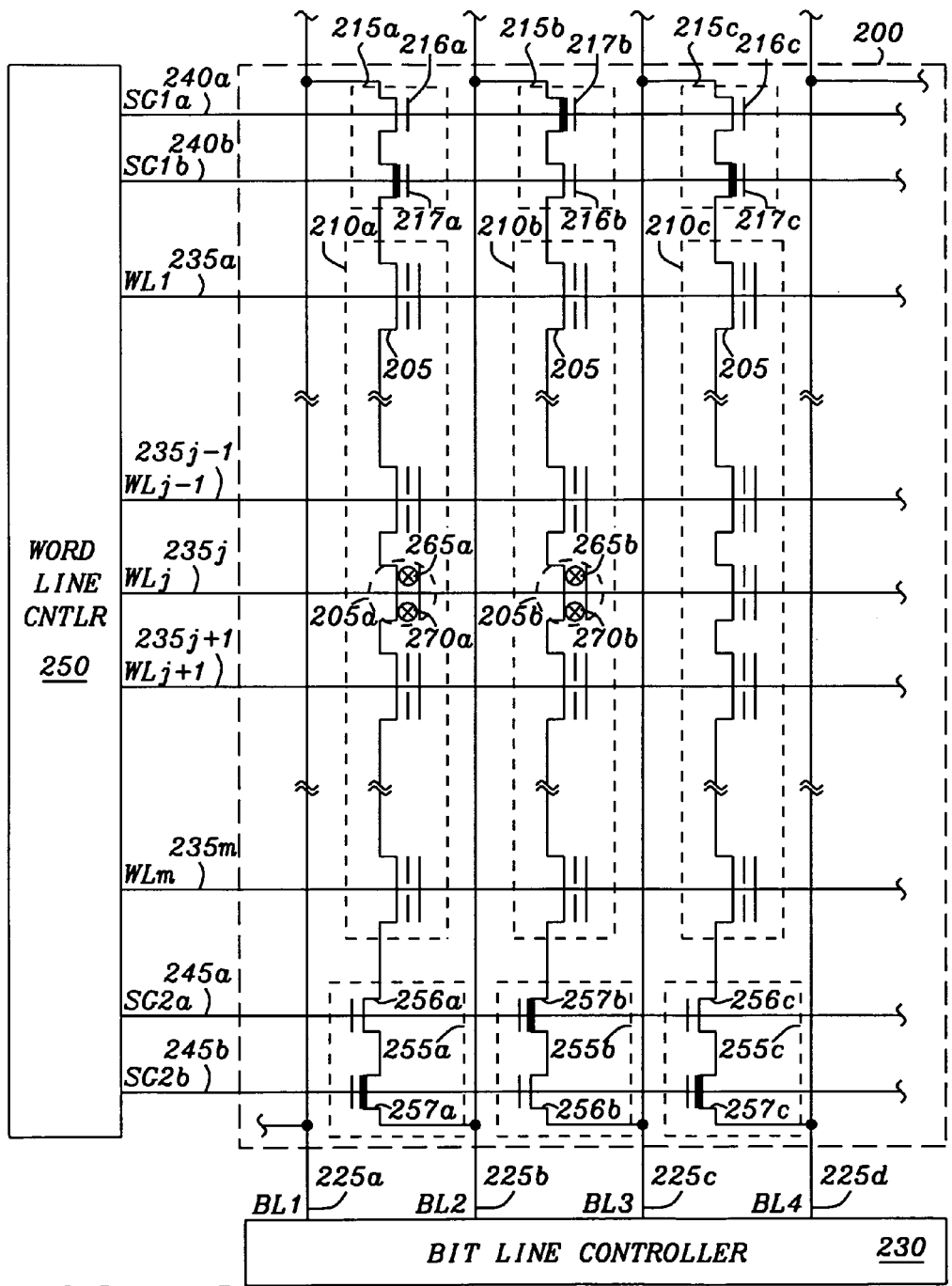
FIG. 3 is a schematic diagram of a second embodiment of an array of multilevel programmed dual-sided nonvolatile memory structures with a pair of serially connected top select transistors and a pair of serially connected bottom select transistors of this invention.

Refer now to FIG. 3 for a second embodiment of the nonvolatile memory array 200. The nonvolatile memory array 200 is formed of dual-sided charge-trapping nonvolatile memory cells of FIG. 1a that are arranged in rows and columns, as described in FIG. 3. The structure of the nonvolatile memory array 200 of this second embodiment is essentially identical to that of the nonvolatile memory array 200 of FIG. 2, except each of the NAND series string groupings 210a, 210b, and 210c now have pairs of serially connected bottom select transistors 255a, 255b, and 255c connected in series with each of the NAND series string groupings 210a, 210b, and 210c. Each of the pairs of serially connected bottom select transistors 255a, 255b, and 255c has a first source/drain connected such that the two first source/drains of the pairs of serially connected bottom select transistors 255a, 255b, and 255c are jointly connected together. One of the serially connected bottom select transistors 257a, 257b, and 257c has an implant to make a threshold voltage of the implanted serially connected bottom select transistor 257a, 257b, and 257c different from a non-implanted second serially connected bottom select transistor 256a, 256b, and 256c. A second source/drain of either bottom select transistor 256a, 257b, and 256c of the pairs of serially connected bottom select transistors 255a, 255b, and 255c is connected to a bottom dual-sided charge-trapping nonvolatile memory cell of the NAND series string groupings 210a, 210b, and 210c. It should be noted that the order of the implanted serially connected bottom select transistors 257a, 257b, and 257c and the non-implanted second serially connected bottom select transistors 256a, 256b, and 256c is inverted between adjacent columns of the nonvolatile memory array 200. Further, it should be noted that the sequence order of which of the implanted serially connected bottom select transistors 257a, 257b, and 257c or the non-implanted second serially connected bottom select transistors 256a, 256b, and 256c is located on a first of the columns of the nonvolatile memory array 200 is not specified.

As in the embodiment of FIG. 2, the second source/drain of the top select transistor of the pairs of serially connected top select transistors 215a, 215b, and 215c of the first adjacent column of the NAND series string groupings 210a, 210b, 210c is connected to the second of the associated pair of bit lines 225a, 225b, 225c, and 225d. In the embodiment of FIG. 3, the second source/drain of the bottom select transistor 257a, 256b, and 257c of the pairs of serially connected bottom select transistors 255a, 255b, and 255c of the first adjacent column 210a, 210b, 210c is connected to the first of the associated pair of bit lines 225a, 225b, 225c, and 225d. Having the top select transistor of the pairs of serially connected top select transistors 215a, 215b, and 215c of one column 210a, 210b, 210c and the bottom select transistor 257a, 256b, and 257c of the pairs of serially connected bottom select transistors 255a, 255b, and 255c of an adjacent column 210a, 210b, 210c connected to the same mutually associated bit line 225a, 225b, 225c, and 225d associated pair of bit lines 225a, 225b, 225c, and 225d provides a cross connective columnar bit line structure.

All of the associated pair of bit lines 225a, 225b, 225c, and 225d are connected to the bit line controller 230. The bit line controller 230 provides the necessary bit line operational voltages to selected dual-sided charge-trapping nonvolatile memory cells 205 for programming, reading, and erasing trapped charges representing multiple digital data bits within a charge trapping region of each of the selected dual-sided charge-trapping nonvolatile memory cells.

A control gate of each of the dual-sided charge-trapping nonvolatile memory cells 205 on each row of the nonvolatile memory array 200 of this invention is connected to one word line 235a, 235b, 235j−1, 235j, 235j+1, and 235m. The gates of the pairs of serially connected top select transistors 215a, 215b, and 215c are connected to the top select gate lines 240a and 240b. The gates of the top select transistors 216a, 217b, and 216c of the pairs of serially connected top select transistors 215a, 215b, and 215c are connected to the top select gate lines 240a and the gates of the second select transistors 217a, 216b, and 217c of the pairs of serially connected top select transistors 215a, 215b, and 215c are connected to the top select gate lines 240b. The gates of the pairs of serially connected bottom select transistors 255a, 255b, and 255c are connected to the bottom select gate lines 245a and 245b. All of the word lines 235a, 235b, 235j−1, 235j, 235j+1, and 235m, top select gate lines 240a and 240b, and the bottom select gate line 245a and 245b are connected to a word line controller 250. The word line controller 250 transfers word line operational voltages for selecting, programming, reading, and erasing the trapped charges representing the multiple digital data bits within the charge trapping region of each of the selected dual-sided charge-trapping nonvolatile memory cells 205.

Figure 4:
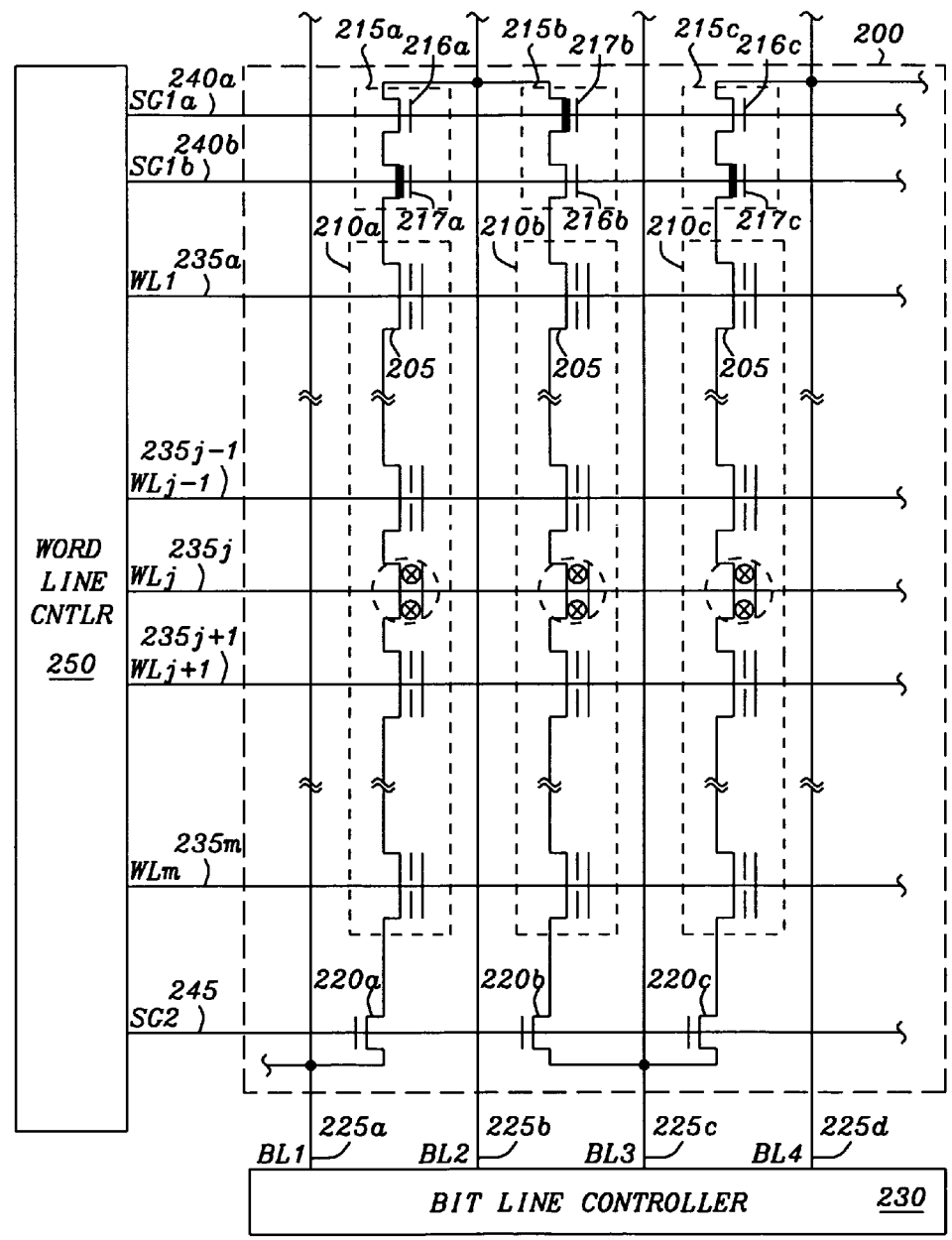
FIG. 4 is a schematic diagram of a third embodiment of an array of multilevel programmed dual-sided nonvolatile memory structures with a pair of serially connected top select transistors of this invention.

FIG. 4 illustrates a third embodiment of the nonvolatile memory array 200. This embodiment has an identical structure to that of FIG. 2 in all attributes except for the connectivity of the NAND series string groupings 210a, 210b, and 210c through the pairs of serially connected top select transistors 215a, 215b, and 215c and the bottom select transistors 220a, 220b, and 220c to the bit lines 225a, 225b, 225c, and 225d. In the embodiment of FIG. 2, the bit lines mutually associated with two adjacent columns of the NAND series string groupings 210a, 210b, and 210c has the pairs of serially connected top select transistors 215a, 215b, and 215c of one of the NAND series string groupings 210a, 210b, and 210c connected to the mutually associated bit line 225a, 225b, 225c, and 225d and the bottom select transistors 220a, 220b, and 220c of the adjacent NAND series string grouping 210a, 210b, and 210c are connected to the mutually associated bit line 225a and 225b, 225c, and 225d. For example the NAND series string groupings 210a and 210b are mutually associated with the bit line 225b. The pair of serially connected top select transistors 215b of the NAND series string grouping 210*b* has it top select transistor 217*b* connected to the mutually associated bit line 225*b*. The bottom select transistor 220*a* of the adjacent NAND series string groupings 210 is connected to the mutually associated bit line 225*b*.

In the embodiment of FIG. 4, the bit lines mutually associated with two adjacent columns of the NAND series string groupings 210*a*, 210*b*, and 210*c* has the pairs of serially connected top select transistors 215*a*, 215*b*, and 215*c* of both of the NAND series string groupings 210*a*, 210*b*, and 210*c* connected to the mutually associated bit line 225*a* and 225*b*, 225*c*, and 225*d*. Similarly, for an alternate bit line 225*a*, 225*b*, 225*c*, and 225*d*, the mutually associated NAND series string groupings 210*a*, 210*b*, and 210*c* have their bottom select transistors 220*a*, 220*b*, 220*c* connected to the alternate bit line 225*a*, 225*b*, 225*c*, and 225*d*. For example the NAND series string groupings 210*a* and 210*b* are mutually associated with the bit line 225*b*. The pair of serially connected top select transistors 215*b* of both of the NAND series string grouping 210*a* and 210*b* have their top select transistors 216*a* and 217*b* connected to the mutually associated bit line 225*b*. For the alternate bit line 225*c*, the NAND series string groupings 210*b* and 210*c* are mutually associated with the alternate bit line 225*c*. In this case the bottom select transistors 220*b*, and 220*c* of the NAND series string groupings 210*b* and 210*c* are connected to the mutually associated bit line 225*c*.

Figure 5:
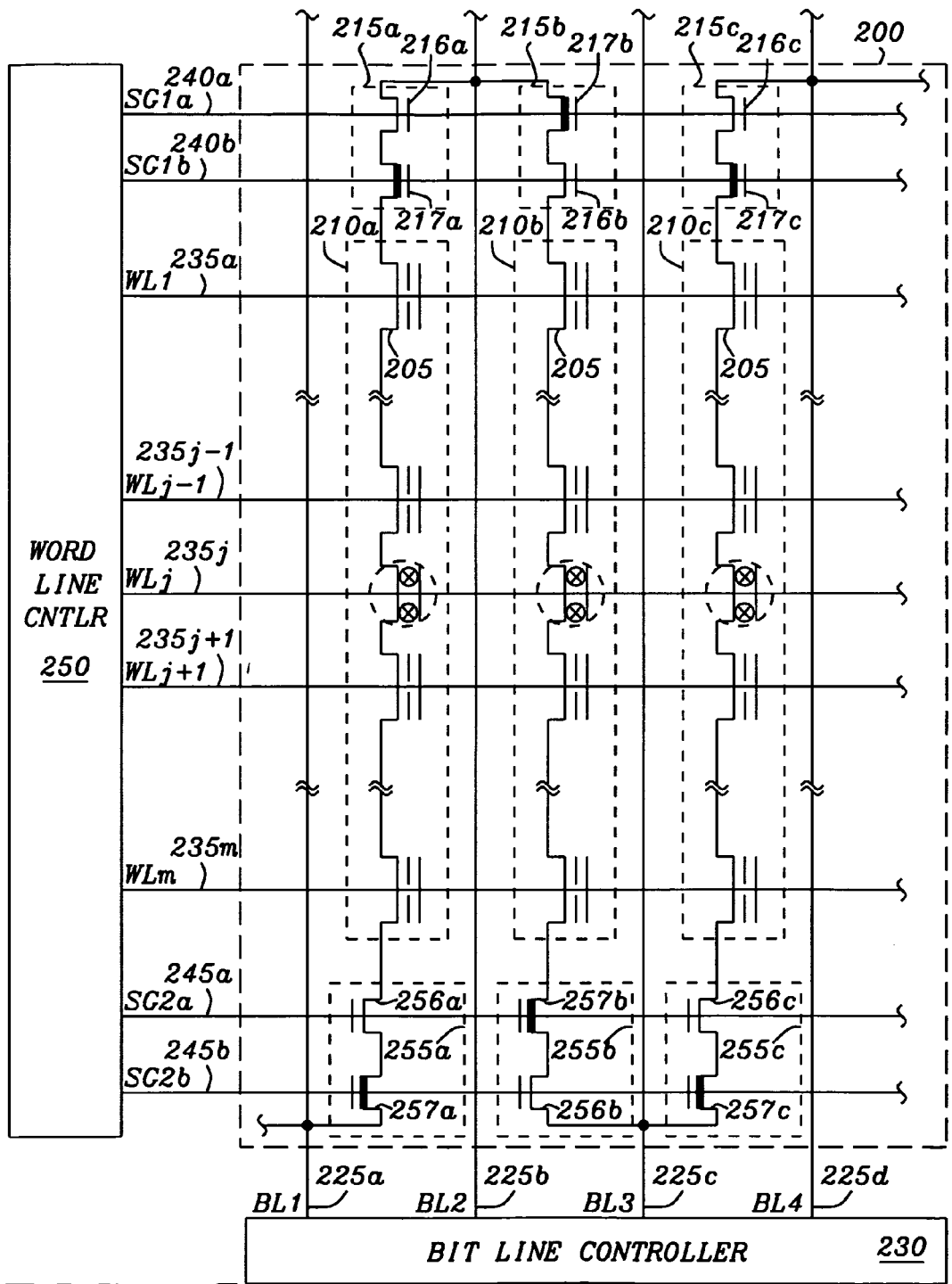
FIG. 5 is a schematic diagram of a fourth embodiment of an array of multilevel programmed dual-sided nonvolatile memory structures with a pair of serially connected top select transistors and a pair of serially connected bottom select transistors of this invention.

FIG. 5 illustrates a third embodiment of the nonvolatile memory array 200. This embodiment has an identical structure to that of FIG. 3 in all attributes except for the connectivity of the NAND series string groupings 210*a*, 210*b*, and 210*c* through the pairs of serially connected top select transistors 215*a*, 215*b*, and 215*c* and the pairs of serially connected bottom select transistors 255*a*, 255*b*, and 255*c* to the bit lines 225*a*, 225*b*, 225*c*, and 225*d*. In the embodiment of FIG. 3, the bit lines mutually associated with two adjacent columns of the NAND series string groupings 210*a*, 210*b*, and 210*c* has the pairs of serially connected top select transistors 215*a*, 215*b*, and 215*c* of one of the NAND series string groupings 210*a*, 210*b*, and 210*c* connected to the mutually associated bit line 225*a*, 225*b*, 225*c*, and 225*d* and the bottom select transistor 257*a*, 256*b*, and 257*c* of the pairs of serially connected bottom select transistors 255*a*, 255*b*, and 255*c* of the adjacent NAND series string grouping 210*a*, 210*b*, and 210*c* are connected to the mutually associated bit line 225*a* and 225*b*, 225*c*, and 225*d*. For example the NAND series string groupings 210*a* and 210*b* are mutually associated with the bit line 225*b*. The pair of serially connected top select transistors 215*b* of the NAND series string grouping 210*b* has its top select transistor 217*b* connected to the mutually associated bit line 225*b*. The bottom select transistor 257*a* of the pair of serially connected bottom select transistors 255*b* of the adjacent NAND series string groupings 210 is connected to the mutually associated bit line 225*b*.

In the embodiment of FIG. 5, the bit lines mutually associated with two adjacent columns of the NAND series string groupings 210*a*, 210*b*, and 210*c* has the pairs of serially connected top select transistors 215*a*, 215*b*, and 215*c* of both of the NAND series string groupings 210*a*, 210*b*, and 210*c* connected to the mutually associated bit line 225*a*, 225*b*, 225*c*, and 225*d* connected to the mutually associated bit line 225*a* and 225*b*, 225*c*, and 225*d*. Similarly, for an alternate bit line 225*a*, 225*b*, 225*c*, and 225*d*, the mutually associated NAND series string groupings 210*a*, 210*b*, and 210*c* have their bottom select transistor 257*a*, 256*b*, and 257*c* of the pairs of serially connected bottom select transistors 255*a*, 255*b*, and 255*c* are connected to the alternate bit line 225*a*, 225*b*, 225*c*, and 225*d*. For example the NAND series string groupings 210*a* and 210*b* are mutually associated with the bit line 225*b*. The pair of serially connected top select transistors 215*b* of both of the NAND series string grouping 210*a* and 210*b* have their top select transistors 216*a* and 217*b* connected to the mutually associated bit line 225*b*. For the alternate bit line 225*c*, the NAND series string groupings 210*b* and 210*c* are mutually associated with the alternate bit line 225*c*. In this case the bottom select transistor 256*b* and 257*c* of the pairs of serially connected bottom select transistors 255*b* and 255*c* of the NAND series string groupings 210*b* and 210*c* are connected to the mutually associated bit line 225*c*.

Figure 6:
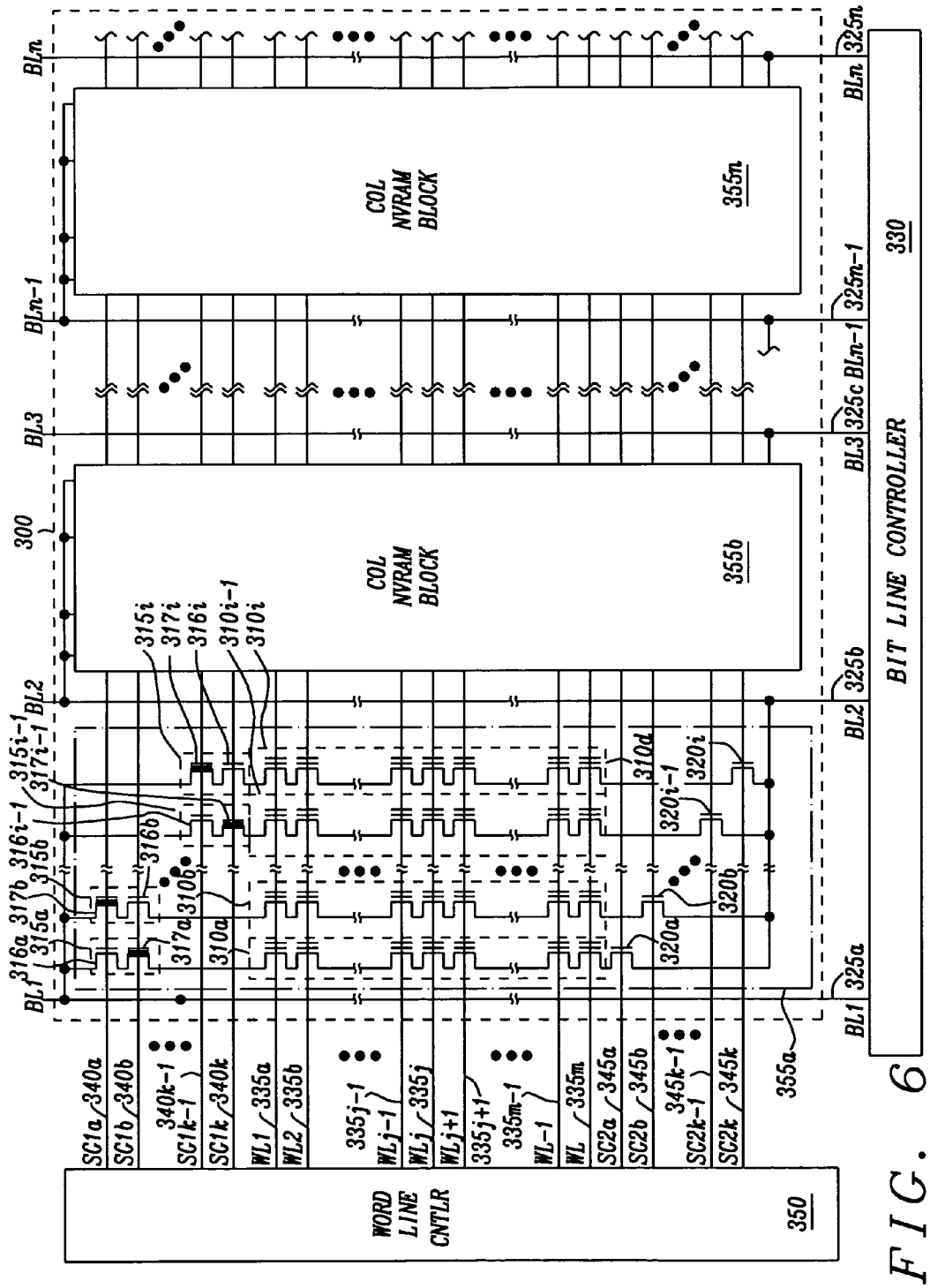
FIG. 6 is a schematic diagram of a general configuration of an array with single NAND series strings of the multilevel programmed dual-sided nonvolatile memory cells with a pair of serially connected top select transistors for each column of this invention.

A more generalized structure of the nonvolatile memory array 300 of this invention is formed of dual-sided charge-trapping nonvolatile memory cells of FIG. 1*a* that are arranged in rows and columns is illustrated in FIG. 6. Groupings 310*a*, 310*b*, ..., 310*i*-1, 310*i* of the dual-sided charge-trapping nonvolatile memory cells 305 resident on each column of the nonvolatile memory array 300 of this invention are connected, as described above, to form NAND series strings of the dual-sided charge-trapping nonvolatile memory cells 305. Each of the NAND series string groupings 310*a*, 310*b*, ..., 310*i*-1, 310*i* have a pair of serially connected top select transistors 315*a*, 315*b*, ..., 315*i*-1, 315*i* and a bottom select transistor 320*a*, 320*b*, ..., 320*i*-1, 320*i*. connected in series with each of the NAND series string groupings 310*a*, 310*b*, ..., 310*i*-1, 310*i*. Each transistor 316*a*, 316*b*, and 316*c* and 317*a*, 317*b*, and 317*c* of the respective pairs of serially connected top select transistors 315*a*, 315*b*, ..., 315*i*-1, 315*i* has a first source/drain connected such that the two first source/drains of the pairs of serially connected top select transistors 215*a*, 215*b*, and 215*c* are jointly connected together. One of the serially connected top select transistors 317*a*, 317*b*, ..., 317*i*-1, 317*i* has an implant to make a threshold voltage of the implanted serially connected top select transistor 317*a*, 317*b*, ..., 317*i*-1, 317*i* different from a non-implanted second serially connected top select transistor 316*a*, 316*b*, ..., 316*i*-1, 316*i*. A second source/drain of either top select transistor 317*a*, 317*b*, ..., 317*i*-1, 317*i* of the pairs of serially connected top select transistors 315*a*, 315*b*, ..., 315*i*-1, 315*i* is connected to a top dual-sided charge-trapping nonvolatile memory cell of the NAND series string groupings 310*a*, 310*b*, ..., 310*i*-1, 310*i*. It should be noted that the order of the implanted serially connected top select transistors 317*a*, 317*b*, ..., 317*i*-1, 317*i* and the non-implanted second serially connected top select transistors 316*a*, 316*b*, ..., 316*i*-1, 316*i* alternates between adjacent columns of the nonvolatile memory array 300. Further, it should be noted that the sequence order of which of the implanted serially connected top select transistors 317*a*, 317*b*, ..., 317*i*-1, 317*i* or the non-implanted second serially connected top select transistors 316*a*, 316*b*, ..., 316*i*-1, 316*i* is located on a first of the columns of the nonvolatile memory array 300.

Each bottom select transistor 320*a*, 320*b*, ..., 320*i*-1, 320*i* has a first source/drain connected to the source of the bottom dual-sided charge-trapping nonvolatile memory cell 305 of each of the NAND series string groupings 310*a*, 310*b*, ..., 310*i*-1, 310*i*. The sources and drains of the pairs of serially connected top select transistors 315*a*, 315*b*, ..., 315*i*-1, 315*i* and the bottom select transistors 320*a*, 320*b*, ..., 320*i*-1, 320*i* are interchangeable in function and therefore are designated first and second source/drains for clarity.

A second source/drain of the top select transistors 316*a*, 317*b*, ..., 316*i*-1, 317*i* of the NAND series string groupings 310*a*, 310*b*, ..., 310*i*-1, 310*i* are connected to a first of the associated pair of bit lines 325*a*. A second source/drain of the bottom select transistor 320*a*, 320*b*, ..., 320*i*-1, 320*i* are connected to a second of the associated pair of bit lines 325*b*.

The structure of the dual-sided charge-trapping nonvolatile memory block 355a includes the NAND series string groupings 310a, 310b, ..., 310i–1, 310i, the pairs of serially connected top select transistors 315a, 315b, ..., 315i–1, 315i, and the bottom select transistors 320a, 320b, ..., 320i–1, 320i connected as above described. The dual-sided charge-trapping nonvolatile memory blocks 355b and 355c are constructed similarly and are connected to the bit lines 325a, 325b, 325c, ..., 325n–2, 325n with each of the dual-sided charge-trapping nonvolatile memory blocks 355b and 355c being connected as described to its associated adjacent bit lines.

It is apparent that one of each of the associated pair of bit lines 325a, 325b, 325c, 325d is associated with two adjacent dual-sided charge-trapping nonvolatile memory blocks 355a, 355b, and 355c. For instance, the bit lines 325b and 325c are associated primarily with the columns with the NAND series strings of the dual-sided charge-trapping nonvolatile memory blocks 355b but the bit line 325b is also associated with the adjacent columns with the NAND series strings dual-sided charge-trapping nonvolatile memory blocks 355a and the bit line 325c is associated with the adjacent columns with the dual-sided charge-trapping nonvolatile memory blocks 355c.

Having the top select transistor of the pairs of serially connected top select transistors 315a, 315b, ..., 315i–1, 315i of a one dual-sided charge-trapping nonvolatile memory blocks 355a, 355b, and 355c and the bottom select transistor 320a, 320b, ..., 320i–1, 320i of an adjacent dual-sided charge-trapping nonvolatile memory blocks 355a, 355b, and 355c connected commonly to one of the bit lines 325a, 325b, 325c, 325d provides the cross connective columnar bit line structure of this invention.

All of the bit lines 325a, 325b, 325c, and 325d are connected to the bit line controller 330. The bit line controller 330 provides the necessary bit line operational voltages to selected dual-sided charge-trapping nonvolatile memory cells 305 for programming, reading, and erasing trapped charges representing multiple digital data bits within a charge trapping region of each of the selected dual-sided charge-trapping nonvolatile memory cells.

A control gate of each of the dual-sided charge-trapping nonvolatile memory cells 305 on each row of the nonvolatile memory array 300 of this invention is connected to one word line 335a, 335b, ... 335j–1, 335j, 335j+1, ... 335m–1, 335m. The gates of the pairs of serially connected top select transistors 315a, 315b, ..., 315i–1, 315i are connected to the top select gate lines 340a, 340b, 340k–1, and 340k. In this embodiment of the nonvolatile memory array 300 of this invention, each of the pairs of serially connected top select transistors 315a, 315b, ..., 315i–1, 315i for each grouping of the dual-sided charge-trapping nonvolatile memory blocks 355a, 355b, and 355c are connected to one of the top select gate lines 340a, 340b, 340k–1, and 340k such that the number of top select gate lines 340a, 340b, 340k–1, and 340k is equal to the number of columns of the NAND series string groupings 310a, 310b, ..., 310i–1, 310i within each dual-sided charge-trapping nonvolatile memory blocks 355a, 355b, and 355c. The gates of the bottom select transistors 320a, 320b, ..., 320i–1, 320i are connected to the bottom select gate lines 345a, 345b, 345k–1, and 345k. All of the word lines 335a, 335b, ... 335j–1, 335j, 335j+1, ... 335m–1, 335m, top select gate lines 340a, 340b, 340k–1, and 340k, and the bottom select gate lines 345a, 345b, 345k–1, and 345k are connected to a word line controller 350. The word line controller 350 transfers word line operational voltages for selecting, programming, reading, and erasing the trapped charges representing the multiple digital data bits within the charge trapping region of each of the selected dual-sided charge-trapping nonvolatile memory cells 305.

It would be apparent to one skilled in the art that the structure as described in FIG. 6 may have any of the structures and connectivity of the NAND series string groupings 210a, 210b, and 210c as illustrated in FIGS. 2, 3, 4, and 5 configured as the NAND series string groupings 310a, 310b, ..., 310i–1, 310i to form the dual-sided charge-trapping nonvolatile memory blocks 355a, 355b, and 355c as shown.

Figure 7:
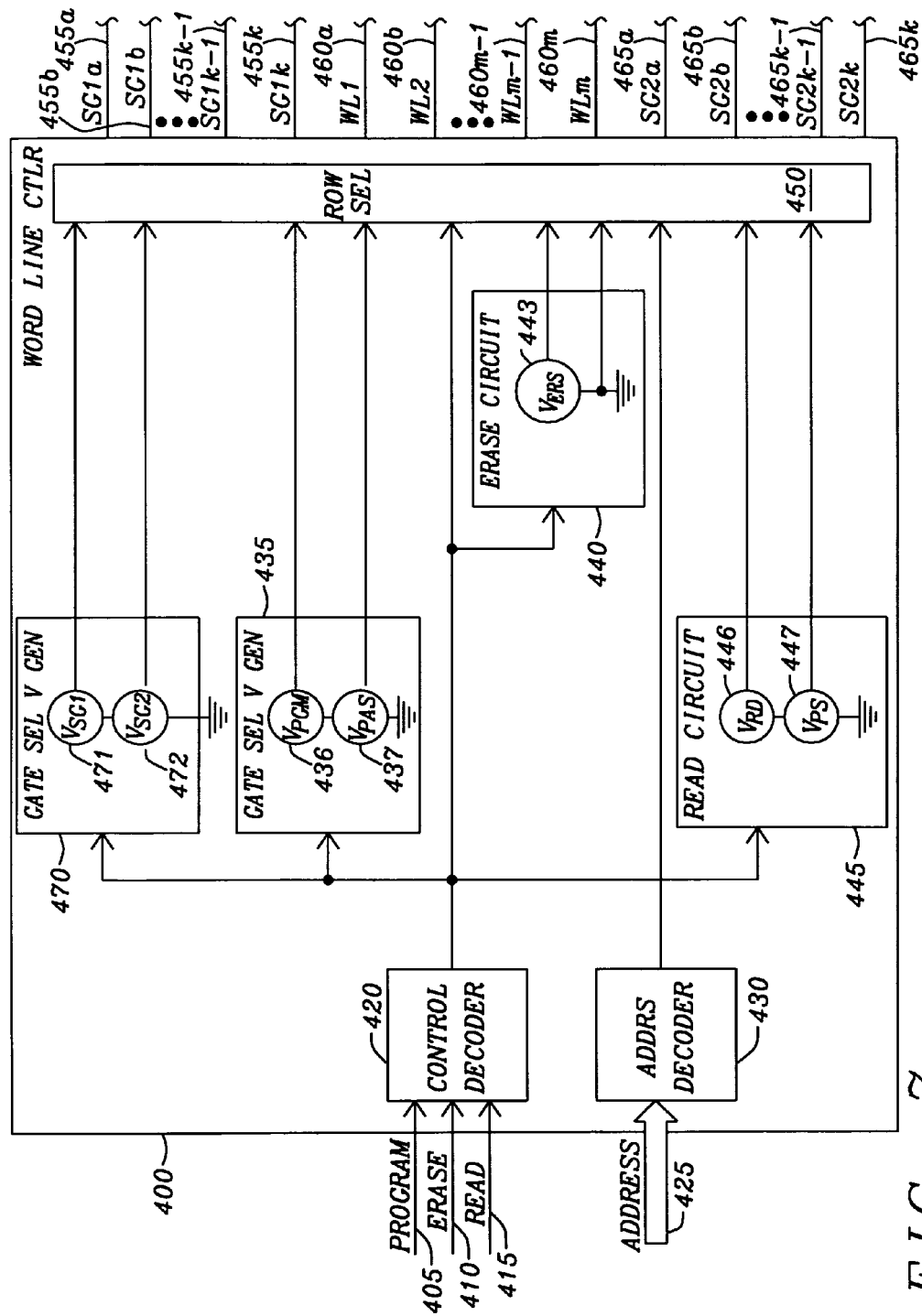
FIG. 7 is a schematic diagram of a word line controller of the array multilevel programmed dual-sided nonvolatile memory structure of this invention.

Refer now to FIG. 7 for a description of the functional structure of the word line controller 400 of the nonvolatile memory array of this invention. The word line controller 400 receives a program control signal 405, an erase control signal 410, and a read control signal 415. The program control signal 405, the erase control signal 410, and the read control signal 415 provides the necessary activation commands that determine the operational mode of the nonvolatile memory array of this invention. It will be understood by one skilled in the art that the program control signal 405, the erase control signal 410, and the read control signal 415 may in fact be components of a command word structure that is applied to the word line controller 400 to perform the program, erase, and read functions. A control decoder 420 receives the program control signal 405, the erase control signal 410, and the read control signal 415, decodes the program control signal 405, the erase control signal 410, and the read control signal 415 and activates the necessary word line functional operation units for the program, erase, and read functions of the nonvolatile memory array of this invention.

The functional operation units are connected to the control decoder 420 to receive the commands to selectively activate the word line functional units that include a word line program circuit 435, a word line erase circuit 440, a word line read circuit 445, and a gate select line voltage generator 470. The program circuit 435 has a word line program voltage source 436 that is connected to one selected word lines 460a, 460b, ... 460m–1, 460m to provide a relatively large program voltage ($V_{PGM}$) of from approximately –6.0V to approximately –15.0V for generating a voltage field between a control gate of the selected dual-sided charge-trapping nonvolatile memory cells and a channel region of the selected dual-sided charge-trapping nonvolatile memory cell. Hot carriers (Hot holes in this embodiment) are extracted from the channel region and are injected into one of the charge trapping regions of the selected dual-sided charge-trapping nonvolatile memory cell.

The non-selected word lines 460a, 460b, ... 460m–1, 460m are coupled to pass voltage generator 437 to generate the pass voltage (Vpas). The pass voltage (Vpas) has to have sufficient amplitude to allow the bit line voltage (VBL) to reach into any bits of any dual-sided charge-trapping nonvolatile memory cell of the selected respective NAND series string groupings. The dual-sided charge-trapping nonvolatile memory cell 205 of their respective NAND series string groupings pass voltage (Vpas) is set to be from approximately +5.0V to approximately +10V.

The gate select line voltage generator 470 provides the appropriate gate select voltage levels ($V_{SG1}$ and $V_{SG2}$) for appropriate activation of the pairs of serially connected top select transistors 215a, 215b, and 215c and bottom select transistors 220a, 220b, and 220c of FIGS. 2 and 4 and the pairs of serially connected top select transistors 215a, 215b, and 215c and pairs of serially connected bottom select transistors 255a, 255b, and 255c of FIGS. 3 and 5. The gate select line voltage generator 470 has a first select line voltage source 471 that selectively provides a first select voltage level ($V_{SG1}$)

and a second select line voltage source 472 that selectively provides a second select voltage level ($V_{SG2}$).

The first and second gate select voltage levels ($V_{SG1}$ and $V_{SG2}$) are transferred on the selected top select gate lines 455a, 455b, . . . 455k−1, 455k to activate the pairs of serially connected top select transistors 215a, 215b, and 215c of FIGS. 2, 3, 4, and 5. The first and second gate select voltage levels ($V_{SG1}$ and $V_{SG2}$) are to be transferred on the select bottom select lines 465a, 465b, . . . 465k−1, 465k to activate the bottom select transistors 220a, 220b, and 220c of FIGS. 2 and 4 and pairs of serially connected bottom select transistors 255a, 255b, and 255c of FIGS. 3 and 5. The first and second gate select voltage levels ($V_{SG1}$ and $V_{SG2}$) are determined by the level and type of implant of the pairs of serially connected top select transistors 215a, 215b, and 215c and pairs of serially connected bottom select transistors 255a, 255b, and 255c of FIGS. 2, 3, 4, and 5, as discussed hereinafter.

The word line erase circuit 440 has a word line erase voltage source 443 that is connected to the selected word lines 460a, 460b, . . . 460m−1, 460m to provide a very large erase voltage ($V_{ERS}$) for generating a voltage field between a control gate of the selected dual-sided charge-trapping nonvolatile memory cells and a channel region of the selected dual-sided charge-trapping nonvolatile memory cell. Hot carriers are injected into the charge trapping region from the channel region of the selected dual-sided charge-trapping nonvolatile memory cell using Fowler-Nordheim tunneling. In the instance where the nonvolatile memory cells are n-channel memory cells the injected hot carriers are hot electrons. In the instance where the nonvolatile memory cells are p-channel memory cells the injected hot carriers are hot holes.

The word line read circuit 445 has a word line read voltage source 446 that is connected to the selected word lines 460a, 460b, . . . 460m−1, 460m to provide a read voltage ($V_{RD}$) to the control gate of the selected dual-sided charge-trapping nonvolatile memory cells that is turned on or not dependent upon the value of the read voltage ($V_{RD}$). The voltage level of the of the word line read voltage source 446 is incremented to determine the threshold voltage level ($V_t$) of the selected dual-sided charge-trapping nonvolatile memory cells that represent the multiple digital data bits stored within two charge trapping regions of the selected dual-sided charge-trapping nonvolatile memory cells. The read circuit 445 has a read pass voltage source 447 that provides a pass voltage level ($V_{PASS}$) that is applied to the non-selected word lines 460a, 460b, . . . 460m−1, 460m to prevent activation of the non-selected word lines 460a, 460b, . . . 460m−1, 460m.

An address word 425 defining the portion of the nonvolatile memory array of this invention that is to be programmed, erased, or read is received by the word line address decoder 430. The decoded address is transferred from the word line address decoder 430 to the row select circuit 450. The decoded address determines which row of the nonvolatile memory array 200 of this invention is to be activated. The decoded control signal is transferred to the row select circuit 450 which to determines the operational voltages that are to be transferred to the word lines 460a, 460b, . . . 460m−1, 460m, the top select gate lines 455a, 455b, . . . 455k−1, 455k and the bottom select lines 465a, 465b, . . . 465k−1, 465k to provide the voltage levels necessary for programming, erasing, and reading the selected row of the nonvolatile memory array of this invention Refer now to FIG. 8 for a description of the functional structure of the bit line controller 500 of the nonvolatile memory array of this invention. The bit line controller 500 receives a program control signal 405, an erase control signal 410, and a read control signal 415. The program control signal 405, the erase control signal 410, and the read control signal 415 provides the necessary activation commands that determine the operational mode of the nonvolatile memory array of this invention, as described above. A control decoder 505 receives the program control signal 405, the erase control signal 410, and the read control signal 415, decodes the program control signal 405, the erase control signal 410, and the read control signal 415 and activates the necessary bit line functional operation units for the program, erase, and read functions of the nonvolatile memory array of this invention.

The functional operation units are connected to the control decoder 505 to receive the commands to selectively activate the bit line functional units that include a bit line program circuit 515, an bit line erase circuit 520, and a bit line read circuit 525. The bit line program circuit 515 has a first, second, and third bit line program voltage source 517, 518, and 59 that is connected to a selected bit lines 535a, 535b, 535c, . . . 535m−1, 535m−1, 535m to provide a bit line program voltages ($V_{BLn}$) necessary for programming each of the charge trapping regions of the dual-sided flash memory cells of the selected row. These levels are set based on the binary digital data to be stored as the trapped charge in the first and second charge trapping regions of the selected dual-sided flash memory cells.

The bit line erase circuit 520 provides a connection 523 to the ground reference voltage source which is applied to selected bit lines 535a, 535b, 535c, . . . 535m−2, 535m−1, 535m. A bit line inhibit voltage source 522 is connected to the non-selected bit lines 535a, 535b, 535c, . . . 535m−2, 535m−1, 535m to provide a bit line inhibit voltage ($V_{INH}$) to inhibit erasure of non-selected dual-sided charge-trapping nonvolatile memory cells.

The bit line read circuit 525 has a bit line drain voltage source 527 that is connected to the selected bit lines 535a, 535b, 535c, . . . 535m−2, 535m−1, 535m to provide a read drain voltage ($V_{DRAIN}$) to the source/drains of the selected dual-sided charge-trapping nonvolatile memory cells that is turned on or not dependent upon the value of the word line read voltage. The bit line read circuit 525 provides a connection 528 to the ground reference voltage source which is applied to opposing source/drain of the selected dual-sided charge-trapping nonvolatile memory cells through the selected bit lines 535a, 535b, 535c, 535m−2, 535m−1, 535m.

The address word 525 that defines the selected portion of the nonvolatile memory array of this invention to be programmed, erased, or read is received by the bit line address decoder 510. The decoded address is transferred from the bit line address decoder 510 to the bit line select circuit 530. The decoded address determines which column of the nonvolatile memory array 200 of this invention is to be activated. The decoded control signal is transferred to the bit line select circuit 510 which to determines the operational voltages that are to be transferred to the selected bit lines 535a, 535b, 535c, . . . 535m−2, 535m−1, 535m to provide the voltage levels necessary for programming, erasing, and reading the selected row of the nonvolatile memory array of this invention.

During the read operation, the current generated by the selected dual-sided charge-trapping nonvolatile memory cells is transferred through the associated pairs of selected bit lines 535a, 535b, 535c, . . . 535m−2, 535m−1, 535m to the bit line select circuit 510 and on to the sense amplifier 540. The sense amplifier detects whether the selected dual-sided charge-trapping nonvolatile memory cells are turned on or not dependent upon the incremented voltage level of the read voltage ($V_{READ}$). From this determination of the trapped charge level of the selected dual-sided charge-trapping nonvolatile memory cells, the multiple digital data bits within two charge trapping regions are determined.

Figure 9C:
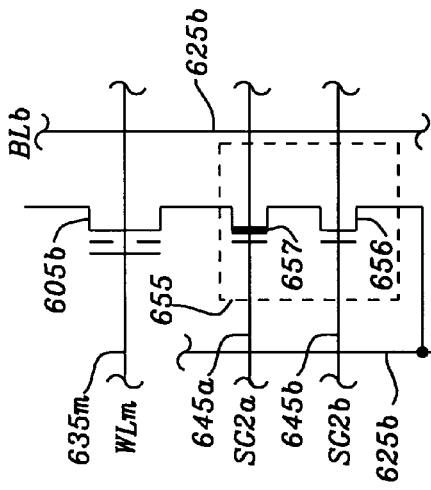
FIGS. 9a, 9b, 9c, and 9d are schematic diagrams of a pair of serially connected bottom select transistors of this invention as connected to a NAND series strings of the multilevel programmed dual-sided nonvolatile memory cells to form the multilevel programmed dual-sided nonvolatile memory cell structure of this invention
Figure 9D:
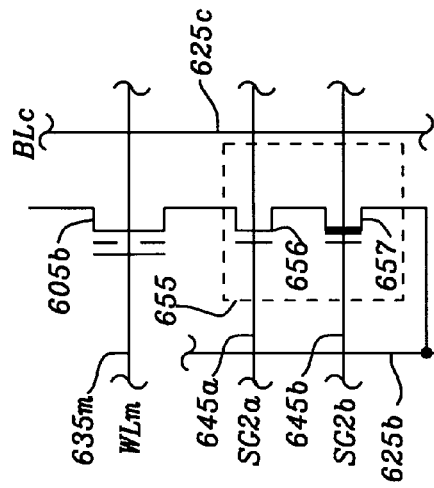
Figure 9A:
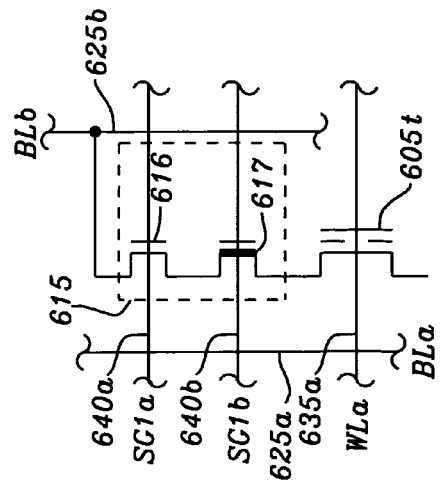
Figure 9B:
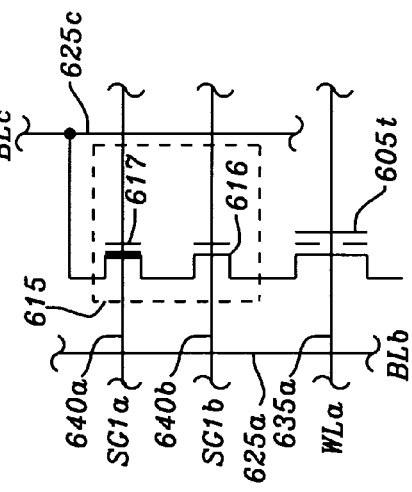
Figure 12:
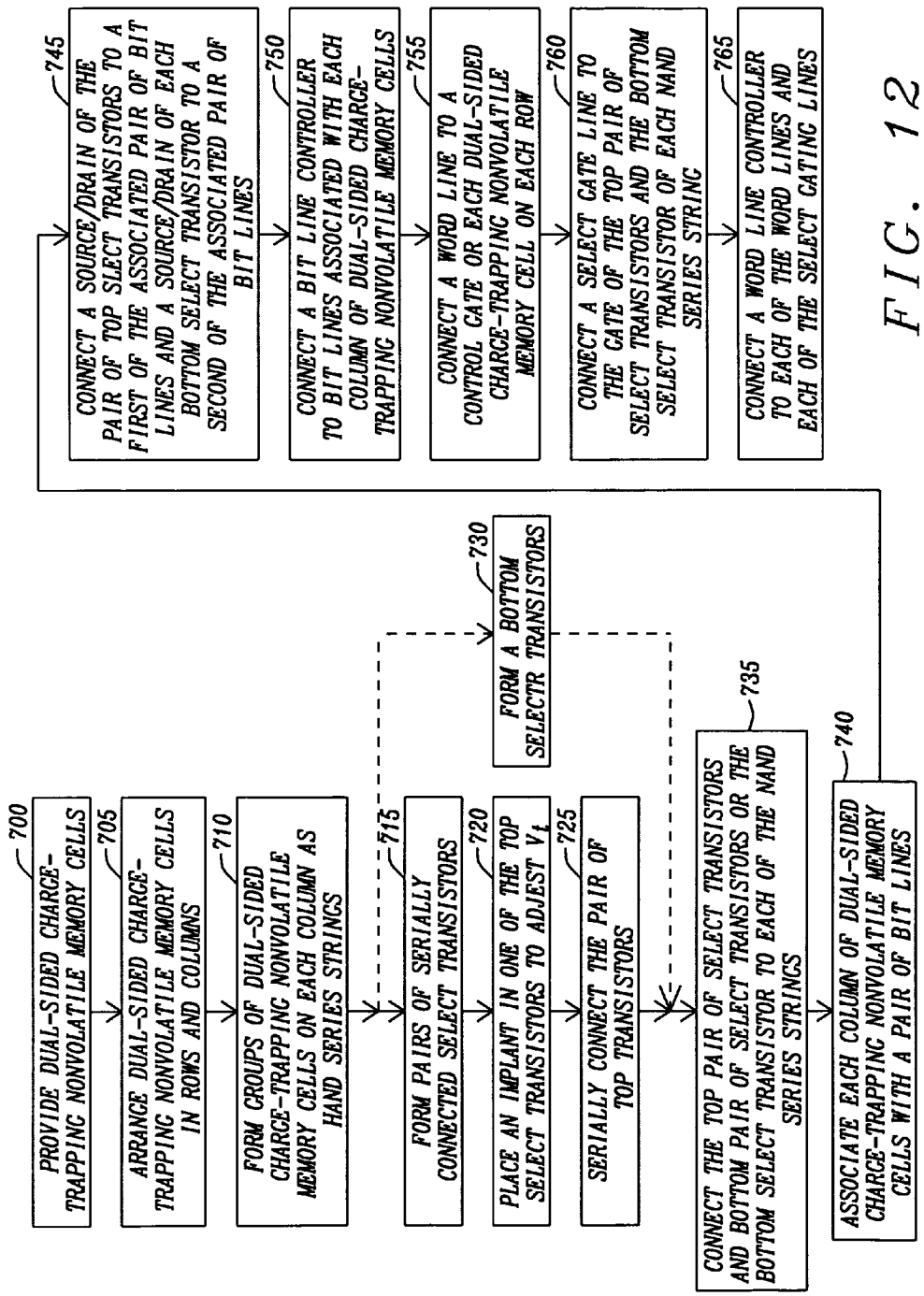
FIG. 12 is a process diagram for the formation of an multilevel programmed dual-sided nonvolatile memory cell structure of this invention.

FIGS. 9a-9d illustrate the pairs of serially connected select transistors 615 of this invention. The pairs of serially connected select transistors 615 include a non-implanted transistor 616 and an implanted transistor 617. The non-implanted transistor 616 and the implanted transistor 617 each have a source/drain that is commonly connected to for the serially connected structure. In FIG. 9a, the non-implanted transistor 616 has a second source/drain connected to the bit line 625b. The second source/drain of the implanted transistor 617 is connected to the top nonvolatile memory cell device 605a of the NAND series strings of the dual-sided charge-trapping nonvolatile memory cells. In FIG. 9b, the order of the pair of serially connected select transistors 615 is reversed from that of FIG. 9a and the second source/drain of the implanted transistor 617 is connected to the bit line 625c. Similarly, the second source drain of the non-implanted transistor 616 is connected to the top nonvolatile memory cell device 605a of the NAND series strings of the dual-sided charge-trapping nonvolatile memory cells.

In FIG. 9c, the order of the pair of serially connected select transistors 615 is reversed from that of FIG. 9a and the non-implanted transistor 616 has a second source/drain connected to the bit line 625a. The second source/drain of the implanted transistor 617 is connected to the bottom nonvolatile memory cell device 605b of the NAND series strings of the dual-sided charge-trapping nonvolatile memory cells. In FIG. 9d, the order of the pair of serially connected select transistors 615 is again reversed from that of FIG. 9b and the second source/drain of the implanted transistor 617 is connected to the bit line 625b. Similarly, the second source drain of the non-implanted transistor 616 is connected to the bottom nonvolatile memory cell device 605b of the NAND series strings of the dual-sided charge-trapping nonvolatile memory cells.

The implanted transistor 617 is optionally implanted with an acceptor impurity such as boron to adjust the threshold voltage ($V_{th}$) to a level of approximately +4.0V. That is compared to the threshold voltage ($V_{th}$) level of approximately +0.7V for an NMOS transistor of the non-implanted transistor 616. Alternately, the implanted transistor 617 is implanted with a donor impurity such phosphorus to adjust the threshold voltage ($V_{th}$) to approximately 4.0V, as compared with the threshold voltage ($V_{th}$) level of approximately +0.7V for the NMOS transistor of the non-implanted transistor 616.

The structure, as shown, is similar to that shown in FIG. 3. By comparing the structures of FIGS. 2, 4, and 5, the orientation and connectivity of the pairs of serially connected select transistors 615 can be adjusted as necessary to provide the alternating of the non-implanted transistors 616 and implanted transistors 617. The differences in the threshold voltages ($V_{th}$) allow selected NAND series strings of the dual-sided charge-trapping nonvolatile memory cells from adjacent columns with mutually associated bit lines 625a, 625b, and 625c, to be selected for program, erase, or read.

The gates of the nonvolatile memory cell devices 605a and 605b of the NAND series string of the dual-sided charge-trapping nonvolatile memory cells and the other memory cell devices (not shown) of the NAND series string of the dual-sided charge-trapping nonvolatile memory cells are connected to the word lines 635a and 635b. The top pairs of serially connected select transistors 615 of FIGS. 9a and 9b have their gates connected to the top select gate lines 640a and 640b. The bottom pairs of serially connected select transistors 615 of FIGS. 9c and 9d have their gates connected to the bottom select gate lines 645a and 645b.

The top and bottom pairs of serially connected select transistors 615 as shown with alternating of the non-implanted transistor 616 and implanted transistor 617 between columns having mutually associated bit lines permits activate of the selected dual-sided charge-trapping nonvolatile memory cells by uniquely decoding select gate signal to the top select gate lines 640a and 640b and bottom select gate lines 645a and 645b.

Refer back now to FIG. 2 for a discussion of the control operation of the first embodiment of the nonvolatile memory array 200 for programming, reading, and erasing trapped charges representing multiple digital data bits within the two charge trapping regions of the selected dual-sided charge-trapping nonvolatile memory cells 205. All of the dual-sided charge-trapping nonvolatile memory cells 205 of the nonvolatile memory array 200 of this invention are essentially structured as shown in FIG. 1a. Multiple digital data bits are stored one charge trapping region at a time in the two separate charge trapping regions of the selected dual-sided charge-trapping nonvolatile memory cells 205.

Figure 8:
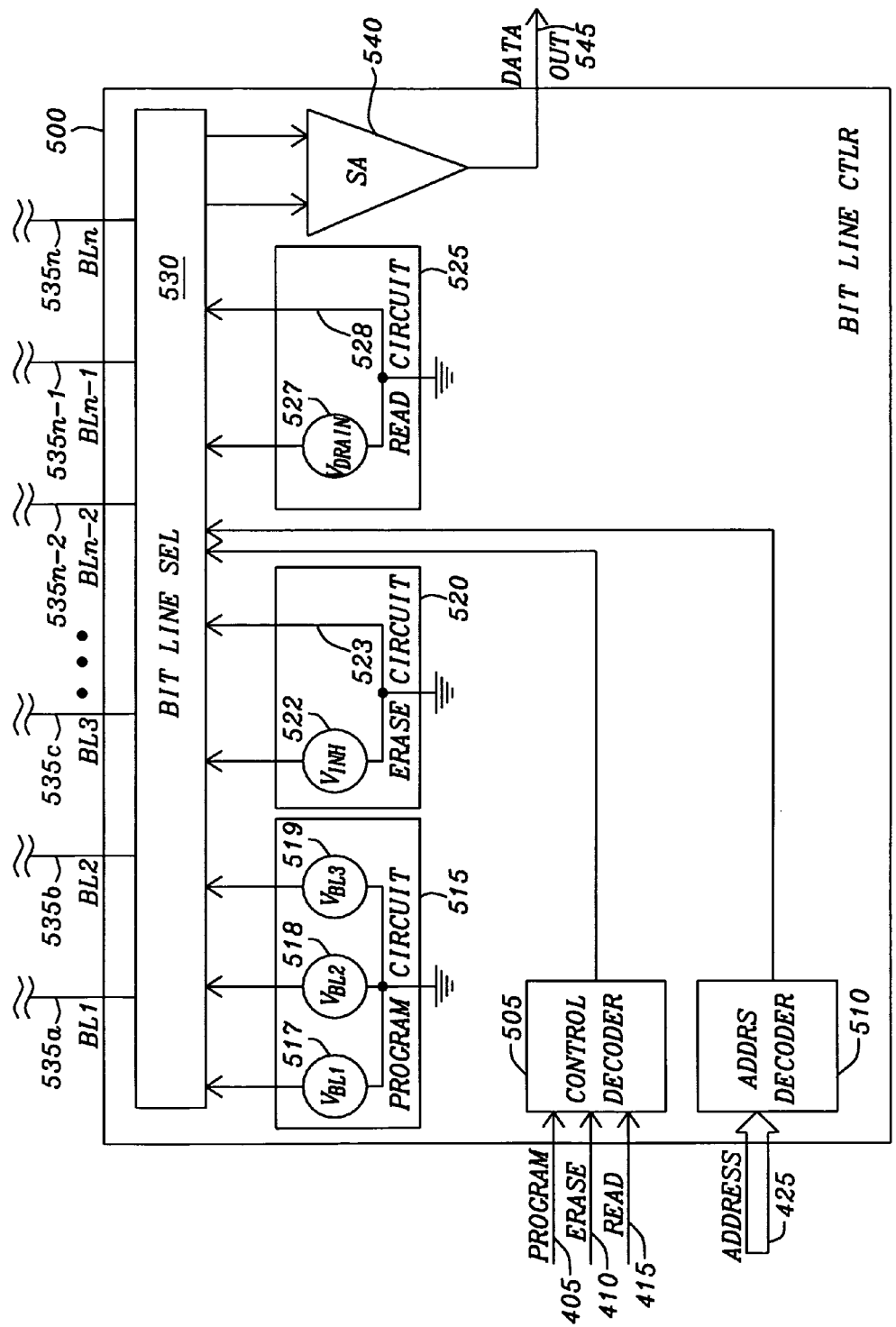
FIG. 8 is a schematic diagram of a bit line controller of the array of multilevel programmed dual-sided nonvolatile memory cell structure of this invention.

To program a selected row of the dual-sided charge-trapping nonvolatile memory cells 205, the bit line program circuit 515 of FIG. 8 within the bit line controller 230 activates the first and second bit line program voltage sources 517 and 518 to provide the bit line program voltages ($V_{BLn}$) necessary for programming each of the charge trapping regions of the dual-sided flash memory cells of the selected row. The word line program circuit 435 of FIG. 7 within the word line controller 250 activates the word line program voltage source 436 that to provide the program voltage ($V_{PGM}$) for generating a voltage field between a control gate of the selected dual-sided charge-trapping nonvolatile memory cells and a channel region of the selected dual-sided charge-trapping nonvolatile memory cell. The program voltage ($V_{PGM}$) is from approximately −7.0V to approximately −10.0V for n-channel selected dual-sided charge-trapping nonvolatile memory cells 205. Alternately, if the selected dual-sided charge-trapping nonvolatile memory cells 205 are a p-channel device the word line voltage level is from approximately +7.0V to approximately +10.0V. It should be noted that the hot carrier charges in the n-channel dual-sided charge-trapping nonvolatile memory cells 205 are hot-holes and in the p-channel selected dual-sided charge-trapping nonvolatile memory cells 205 are hot-electrons. The program state of the charge trapping regions of the selected dual-sided charge-trapping nonvolatile memory cells 205 being determined by the number of hot-carriers injected into each of the charge trapping regions.

To program the charge of both of the trapping regions simultaneously, the first bit line program voltage source 517 is set to the bit line voltage level (VBLN) that represents the digital data to programmed to the first charge trapping region and the second bit line program voltage source 518 is set to the bit line voltage level (VBLN) that represents the digital data to programmed to the second charge trapping region. For example if there are to be two binary digits programmed to each of the charge trapping regions, the first bit line program voltage source 517 and the second bit line program voltage source 518 are set according to the voltage levels according to Table 1.

TABLE 1

| Binary Digit to first charge trapping region 65 of FIG. 1a | Binary Digit to second charge trapping region 70 of FIG. 1a | VBLn Level | VBLn Level |
| --- | --- | --- | --- |
| 00 | 00 | VBL1 | VBL1 |
| 00 | 01 | VBL1 | VBL2 |
| 00 | 10 | VBL1 | VBL3 |
| 00 | 11 | VBL1 | VBL4 |
| 01 | 00 | VBL2 | VBL1 |
| 01 | 01 | VBL2 | VBL2 |
| 01 | 10 | VBL2 | VBL3 |
| 01 | 11 | VBL2 | VBL4 |
| 10 | 00 | VBL3 | VBL1 |
| 10 | 01 | VBL3 | VBL2 |
| 10 | 10 | VBL3 | VBL3 |
| 10 | 11 | VBL3 | VBL4 |
| 11 | 00 | VBL4 | VBL1 |
| 11 | 01 | VBL4 | VBL2 |
| 11 | 10 | VBL4 | VBL3 |
| 11 | 11 | VBL4 | VBL4 |

As noted in Atwood, et al., "The charge storage ability of the flash memory cell is a key to the storage of multiple bits in a single cell. The flash cell is an analog storage device not a digital storage device. It stores charge (quantized at a single electron) not bits." The bit line controller 230 and the word line controller 250 of this invention places a precise amount of charge in the charge trapping regions such that in the nonvolatile memory array 200 of this invention the distribution of the charges as shown in FIG. 1c are sufficiently restricted that program states of each of the charge trapping regions are detectable. In one implementation of the nonvolatile memory array 200 of this invention the distribution of the program states is within a narrow range of differences in threshold voltage levels ($\Delta V_t$) are set such that there is a detection window of approximately 0.7V. Assuming the ability to differentiate the differences in threshold voltage levels ($\Delta V_t$) for each binary digit of the programmed data, any number of bits conceptually may be programmed by the bit line controller 230 and the word line controller 250 of this invention to the charge trapping regions selected dual-sided charge-trapping nonvolatile memory cells 205.

To erase a selected row of the dual-sided charge-trapping nonvolatile memory cells 205, the bit line erase circuit 520 of FIG. 8 within the bit line controller 230 connects the pairs of bit lines 225a, 225b, 225c, . . . 225n–2, 225n–1, 225n to the ground reference voltage source 623. Any of the associated pair of bit lines 225a, 225b, 225c, . . . 225n–2, 225n–1, 225n not being erased are connected to the bit line inhibit voltage source 622 to prevent the erasure of the charge trapping regions. The bit line inhibit voltage source 622 is set to an inhibit voltage level of from approximately +7.5V to approximately +10V. To inject the hot carriers injected during the programming of the selected dual-sided charge-trapping nonvolatile memory cells 205, the word line erase circuit 440 of FIG. 7 is set to provide a word line erase voltage level of from approximately +15V to approximately +20V for the n-channel dual-sided charge-trapping nonvolatile memory cells 205. Alternately, if the dual-sided charge-trapping nonvolatile memory cells 205 are p-channel devices the word line erase voltage level is from approximately –15V to approximately –20V.

A read operation of the nonvolatile memory array 200 of this invention, is where the first charge trapping region is read in one direction and the second charge trapping region is read in the opposite direction. During each directional read operation, the word line read voltage source 446 within the word line read circuit 445 of the word line controller 400 is connected to the selected word lines 460a, 460b, . . . 460m–1, 460m to provide a read voltage ($V_{READ}$). For reading the program state of the first charge trapping region, the word line read voltage source 446 is set to the read voltage level ($V_{READ}$). The bit line read circuit 525 sets the first of the associated pair of bit lines 535a, 535b, 535n–2, . . . 535n–1, 535n to the ground reference voltage level (0V) and the second associated pair of bit lines 535a, 535b, 535n–2, . . . 535n–1, 535n the drain read voltage ($V_{DRAIN}$). As noted above, the read voltage level ($V_{READ}$) must be varied incrementally through each of the threshold boundary voltage levels (VPVn) as shown in FIG. 1c to determine the program state of the first charge trapping regions. For reading the program state of the second charge trapping regions, the word line voltage source 446 is set to the read voltage level ($V_{READ}$). The bit line read circuit 525 sets the first of the associated pair of bit lines 535a, 535b, 535n–2, 535n–1, 535n to the drain read voltage ($V_{DRAIN}$) and the second of the associated pair of bit lines 535a, 535b, 535n–2, . . . 535n–1, 535n to the ground reference voltage level (0V). Again, as noted above, the read voltage level ($V_{READ}$) must be varied incrementally through each of the threshold boundary voltage levels (VPVn) as shown in FIG. 1c to determine the program state of the second charge trapping region of the selected row of the dual-sided charge-trapping nonvolatile memory cells 205.

During the read operation, the sense amplifier 540 of FIG. 8 determines whether the selected dual-sided charge-trapping nonvolatile memory cells 205 are conducting or not in each direction. Based on the threshold boundary voltage level (VPVn) and the conduction of the selected dual-sided charge-trapping nonvolatile memory cells 205, the sense amplifier 540 determines the binary digital data programmed in each of the charge trapping regions and transfers the binary digital data to external circuitry through the data input/output bus 545.

As shown above, the bit line controller 500 of FIG. 8 and the word line controller 400 of FIG. 7 function in concert for operation of the nonvolatile memory array 200 of this invention. Refer now to FIGS. 2 and 10a for a description of a single sided program operation of the array of dual-sided charge-trapping nonvolatile memory cells 205. In FIG. 2 the dual-sided charge-trapping nonvolatile memory cells 205a and 205b are designated as examples of the program operation of selected dual-sided charge-trapping nonvolatile memory cells 205. The row containing the selected dual-sided charge-trapping nonvolatile memory cells 205a and 205b is connected to the selected word line 235j. The word line program voltage level ($V_{PGM}$) is applied to the selected word line 235j and thus to the control gates of the selected dual-sided charge-trapping nonvolatile memory cells 205a and 205b. The non-selected rows of dual-sided charge-trapping nonvolatile memory cells 205 are connected to the remaining word lines 235a, 235b, . . . 235j–1, 235j+1, . . . 235m–1, 235m of the nonvolatile memory array 200 of this embodiment. The word line controller sets these non-selected word line 235a, 235b, . . . 235j–1, 235j+1, . . . 235m–1, 235m and thus the non-selected dual-sided charge-trapping nonvolatile memory cells 205 to the pass voltage level ($V_{PASS}$).

The bit line controller 230 sets the bit lines 535a, 535b, 535c, . . . 535m–2, 535m–1, 535m the bit line program voltages ($V_{BLn}$) necessary for programming each of the first charge trapping regions (BIT 1) 265a and 265b and the second charge trapping regions (BIT 2) 270a and 270b of the dual-sided charge-trapping nonvolatile memory cells 205a and 205b of the selected row. These levels are set based on the binary digital data to be stored as the trapped charge in the first and second charge trapping regions of the selected dual-sided flash memory cells.

To select first charge trapping regions (BIT 1) 265a and 265b of the selected dual-sided charge-trapping nonvolatile memory cells 205a and 205b, the top select gate lines 240a and 240b and thus the gates of the pairs of serially connected top select transistors 215a, 215b, and 215c are set to the first gate select voltage level ($V_{SG1}$) to activate the pairs of serially connected top select transistors 215a, 215b, and 215c to connect the NAND series string groupings 210a, 210b, and 210c of dual-sided charge-trapping nonvolatile memory cells 205 to their associated bit lines 225a, 225b, and 225c. The bottom select gate line 245 and thus the gates of the bottom select transistors 220a, 220b, and 220c are set to the second gate select voltage level ($V_{SG2}$) to deactivate the bottom select transistors 220a, 220b, and 220c to insure that the second sides of the NAND series string groupings 210a, 210b, and 210c of dual-sided charge-trapping nonvolatile memory cells 205 are disconnected from their associated bit lines 225a, 225b, and 225c.

To select second sides (BIT 2) 270a and 270b of the selected dual-sided charge-trapping nonvolatile memory cells 205a and 205b, the bottom select gate line 245 and thus the gates of the bottom select transistors 220a, 220b, and 220c are set to the first gate select voltage level ($V_{SG1}$) to activate the bottom select transistors 220a, 220b, and 220c to connect the NAND series string groupings 210a, 210b, and 210c of dual-sided charge-trapping nonvolatile memory cells 205 to their associated bit lines 225a, 225b, and 225c. The selected dual-sided charge-trapping nonvolatile memory cells 205a and 205b, the top select gate lines 240a and 240b and thus the gates of the pairs of serially connected top select transistors 215a, 215b, and 215c are set to the second gate select voltage level ($V_{SG2}$) to deactivate the pairs of serially connected top select transistors 215a, 215b, and 215c to insure that the first sides (BIT 1) 265a and 265b of the selected dual-sided charge-trapping nonvolatile memory cells 205 are disconnected from their associated bit lines 225a, 225b, and 225c. This process as described is accomplishes programming the first sides (BIT 1) 265a and 265b and the second sides (BIT 2) 270a and 270b of the selected dual-sided charge-trapping nonvolatile memory cells 205a and 205b in a serial fashion.

As noted above the implants of the implanted transistor of the pairs of serially connected top select transistors 215a, 215b, and 215c is implanted with either an acceptor impurity such as boron to adjust the threshold voltage ($V_{th}$) to a level of approximately +4.0V or a donor impurity such phosphorus to adjust the threshold voltage ($V_{th}$) to approximately −4.0V. In the case of the pairs of serially connected top select transistors 215a, 215b, and 215c with implanted transistor ($V_{th}$ more than +4.0V) in series with a regular enhancement non-implanted transistor 216a, 216b, and 216c ($V_{th}$=+0.7V), the second gate select voltage level ($V_{SG2}$) turns on only the non-implanted transistors 216a, 216b, and 216c. the second gate select voltage level ($V_{SG2}$) is set to be in-between the threshold voltages of the non-implanted transistor 216a, 216b, and 216c and 256a, 256b, and 256c and the implanted transistor 217a, 217b, and 217c of the pairs of serially connected top select transistors 215a, 215b, and 215c.

In the case of the pairs of serially connected top select transistors 215a, 215b, and 215c with the implanted transistor 217a, 217b, and 217c implanted with an donor impurity ($V_{th}$<−2.0V or negative) in series with a regular enhancement non-implanted transistor 216a, 216b, and 216c ($V_{th}$=+0.7V), the second gate select voltage level (VSG2) turns on only the implanted transistors 217a, 217b, and 217c of the pairs of serially connected top select transistors 215a, 215b, and 215c. The second gate select voltage level ($V_{SG2}$) is again set to be in-between the threshold voltages of the non-implanted transistors 216a, 216b, and 216c and the implanted transistors 217a, 217b, and 217c of the pairs of serially connected top select transistors 215a, 215b, and 215c. The first gate select voltage level ($V_{SG1}$) in both cases of an acceptor or a donor of implanted transistors is set large enough to turn on both non-implanted transistors 216a, 216b, and 216c and the implanted transistors 217a, 217b, and 217c of the pairs of serially connected top select transistors 215a, 215b, and 215c.

Table 2 provides the program voltage levels for the two implementations of the implanted transistor of the pairs of serially connected top select transistors 215a, 215b, and 215c.

TABLE 2

| Voltage Level | Donor Implant such as Phosphorus | Acceptor Implant such as Boron |
|---|---|---|
| $V_{SG1}$ | ~+5.0 V to ~+10.0 V | ~+10.0 V to ~+15.0 V |
| $V_{SG2}$ | ~+0 V to ~+2.0 V | ~+0 V to ~+2.0 V |
| $V_{PGM}$ | ~−6.0 V to ~−15.0 V | ~−6.0 V to ~−15.0 V |
| $V_{PASS}$ | ~+5.0 V to ~+10.0 V | ~+5.0 V to ~+10.0 V |
| $V_{BL1,2,3}$ | ~+3.00 V to ~+5.0 V | ~+3.00 V to ~+5.0 V |

Erasure of the nonvolatile memory array 200 of dual-sided charge-trapping nonvolatile memory cells 205 of this invention is illustrated in FIGS. 2 and 10b. The erasure is shown as a row wise erase, where a selected row received a word line erase voltage level ($V_{ERS}$) from the selected word line 235j as applied by the word line controller 250. The word line erase voltage level is from approximately +15V to approximately +20V for n-channel dual-sided charge-trapping nonvolatile memory cells 205a and 205b to inject hot electrons into the charge trapping region. The word line controller 250 applies the ground reference voltage level (0V) to the non-selected word line 235a, 235b, ... 235j−1, 235j+1, ... 235m−1, 235m and thus to the dual-sided charge-trapping nonvolatile memory cells 205 to prevent removal of the trapped charges from the first and second charge trapping regions of the non-selected dual-sided charge-trapping nonvolatile memory cells 205.

The bit line controller 230 applies the ground reference voltage level (0V) to each of the associated pair of bit lines 225a, 225b, 225c, and 225d for a complete erase. In an array configuration, certain cells require that they not be subjected to the erasure operation. In this circumstance, the bit line controller 230 applies an inhibit voltage level ($V_{INH}$) of from approximately +7.5V to approximately +10V to those associated pair of bit lines 225a, 225b, 225c, 225d that are sufficiently erased and do not require further erasure. To provide the connections of the NAND series string groupings 210a, 210b, and 210c to the associated bit lines 225a, 225b, and 225c, the pairs of serially connected top select transistors 215a, 215b, and 215c and the bottom select transistors 220a, 220b, and 220c are activated when the bit line controller 230 sets the top select gate lines 240a and 240b and the bottom select gate line 245 to the first gate select voltage level ($V_{SG1}$) during the erasure time.

Refer now to FIGS. 2 and 10c for the explanation of the reading of a selected row of the dual-sided charge-trapping nonvolatile memory cells 205. A selected row of the dual-sided charge-trapping nonvolatile memory cells 205a and 205b has the word line read voltage level ($V_{READ}$) applied to the associated word line 235j and thus to the control gates of the selected n-channel dual-sided charge-trapping nonvolatile memory cells 205a and 205b. The non-selected rows of dual-sided charge-trapping nonvolatile memory cells 205 are connected to the remaining word lines 235a, 235b, ... 235j–1, 235j+1, ... 235m–1, 235m of the array. The word line controller 250 sets these word lines 235a, 235b, ... 235j–1, 235j+1, ... 235m–1, 235m and thus the dual-sided charge-trapping nonvolatile memory cells 205 to a word line read pass voltage level ($V_{PASS}$). The word line read pass voltage level ($V_{PASS}$) insures that the non-selected rows of dual-sided charge-trapping nonvolatile memory cells 205 are not activated during the read operation.

To read the first charge trapping region (BIT 1) 265a and 265b of the dual-sided charge-trapping nonvolatile memory cells 205a and 205b, the word line controller 250 sets the top select gate lines 240a and 240b to the first gate select voltage level ($V_{SG1}$) to activate the top select gate lines 240a and 240b to connect the first charge trapping region (BIT 1) 265a and 265b its associated bit lines 225a, 225b, and 225c. The word line controller 250 then sets the bottom select gate line 245 to the second gate select voltage level ($V_{SG2}$) to deactivate the bottom select transistors 220a, 220b, and 220c to prevent the second charge trapping region (BIT 2) 270a and 270b of the selected dual-sided charge-trapping nonvolatile memory cells 205a and 205b from being connected to the bit lines 225a, 225b, and 225c. The bit line controller 230 sets the first of the associated pairs of bit lines 225a, 225b, 225c, and 225d connected to the first charge trapping region (BIT 1) 265a and 265b to the ground reference voltage level (0V) and the second of the associated bit lines 225a, 225b, and 225c connected to the second charge trapping regions to the drain read voltage ($V_{DRAIN}$). As noted above, the read voltage level ($V_{READ}$) must be varied incrementally through each of the threshold boundary voltage levels (VPVn) as shown in FIG. 1c to determine the program state of the first charge trapping region of each of the selected dual-sided charge-trapping nonvolatile memory cells 205a and 205b.

For reading the program state of the second charge trapping region (BIT 2) 270a and 270b of the selected dual-sided charge-trapping nonvolatile memory cells 205a and 205b of the selected n-channel dual-sided charge-trapping nonvolatile memory cells 205a and 205b, the word line controller 250 sets the bottom select gate line 245 to the first gate select voltage level ($V_{SG1}$) to activate the bottom select transistors 220a, 220b, and 220c to connect the second charge trapping region (BIT 2) 270a and 270b its associated bit lines 225a, 225b, and 225c. The word line controller 250 then sets the top select gate lines 240a and 240b to the second gate select voltage level ($V_{SG2}$) to deactivate the pairs of serially connected top select transistors 215a, 215b, and 215c to prevent the first charge trapping region (BIT 1) 265a and 265b of the selected dual-sided charge-trapping nonvolatile memory cells 205a and 205b from being connected to the bit lines 225a, 225b, and 225c.

The bit line controller 230 sets the first of the associated bit lines 225a, 225b, and 225c connected to the first charge trapping regions to the drain read voltage ($V_{DRAIN}$) and the second of the associated pair of bit lines 225a, 225b, and 225c connected to the second charge trapping regions to the ground reference voltage level (0V). Again, as noted above, the read voltage level ($V_{READ}$) must be varied incrementally through each of the threshold boundary voltage levels (VPVn) as shown in FIG. 1c to determine the program state of the second charge trapping region of each of the selected dual-sided charge-trapping nonvolatile memory cells 205.

It should be noted that the drain read voltage ($V_{DRAIN}$) level must be sufficient to overcome threshold voltages of the first and second charge trapping regions and not sufficient to cause soft writing of the dual-sided charge-trapping nonvolatile memory cells 205. The first gate select voltage level ($V_{SG1}$) and second gate select voltage level ($V_{SG2}$) are as noted for the programming in Table 2. for both the erase and the read operation.

During the read operation, a sense amplifier within the bit line controller 230 determines whether the selected dual-sided charge-trapping nonvolatile memory cells 205 are conducting or not in each direction. Based on the threshold boundary voltage level (VPVn) and the conduction of the selected dual-sided charge-trapping nonvolatile memory cells 205, the sense amplifier determines the binary digital data programmed in each charge trapping regions of the selected dual-sided charge-trapping nonvolatile memory cells 205 and transfers the binary digital data to external circuitry through an data input/output bus.

The control operation of the second embodiment of the nonvolatile memory array 200 for programming, reading, and erasing trapped charges representing multiple digital data bits within the two charge trapping regions of the selected dual-sided charge-trapping nonvolatile memory cells 205 of FIG. 3 is essentially identical as that of FIG. 2 with the exception of the activation of the pairs of serially connected bottom select transistors 255a, 255b, and 255c. For Program and Read operations of the second charge trapping region (BIT 2) 270a and 270b, the gate select line voltage generator 470 of FIG. 7 provides the appropriate gate select voltage levels ($V_{SG1}$ and $V_{SG2}$) to the bottom select gate lines 245a and 245b for appropriate activation pairs of serially connected bottom select transistors 255a, 255b, and 255c of FIG. 3.

The gate select line voltage generator 470 has a first select line voltage source 471 that selectively provides the first select voltage level ($V_{SG1}$) and the second select line voltage source 472 that selectively provides a second select voltage level ($V_{SG2}$). As described above, the first and second gate select voltage levels ($V_{SG1}$ and $V_{SG2}$) are determined by the level and type of implant of the pairs of serially connected top select transistors 215a, 215b, and 215c and pairs of serially connected bottom select transistors 255a, 255b, and 255c. In Table 1, the first gate select voltage level ($V_{SG1}$) is larger than the second gate select voltage level ($V_{SG2}$). If the first gate select voltage level ($V_{SG1}$) is applied to either or both top select gate lines 240a and 240b or either of both of the bottom select gate lines 245a and 245b, both the non-implanted transistors 216a, 216b, and 216c and implanted transistors 217a, 217b, and 217c are turned on. Conversely, If the second gate select voltage level ($V_{SG2}$) is applied to either or both top select gate lines 240a and 240b or either of both of the bottom select gate lines 245a and 245b, the non-implanted transistors 216a, 216b, and 216c are not turned on and implanted transistors 217a, 217b, and 217c are turned on. This permits the selection of the columns of the NAND series string groupings 210a, 210b, and 210c for connection to the bit lines 225a, 225b, and 225c. This further allows for simultaneous writing of the first and second charge trapping regions (BIT 1 and BIT 2) 265a or 265b and 270a or 270b of the selected dual-sided charge-trapping nonvolatile memory cells 205a or 205b.

Refer now to FIGS. 3 and 10a for a description of a simultaneous dual sided program operation of the array of dual-sided charge-trapping nonvolatile memory cells 205. In FIG. 3 the dual-sided charge-trapping nonvolatile memory cells 205a and 205b are designated as examples of the program operation of selected dual-sided charge-trapping nonvolatile memory cells 205. The row containing the selected dual-sided charge-trapping nonvolatile memory cells 205a and 205b is connected to the selected word line 235j. The word line program voltage level ($V_{PGM}$) is applied to the selected word line 235j and thus to the control gates of the selected dual-sided charge-trapping nonvolatile memory cells 205a and 205b. The non-selected rows of dual-sided charge-trapping nonvolatile memory cells 205 are connected to the remaining word lines 235a, 235b, ... 235j−1, 235j+1, ... 235m−1, 235m of the nonvolatile memory array 200 of this embodiment. The word line controller sets these non-selected word line 235a, 235b, ... 235j−1, 235j+1, ... 235m−1, 235m and thus the non-selected dual-sided charge-trapping nonvolatile memory cells 205 to the pass voltage level ($V_{PASS}$).

The bit line controller 230 sets the bit lines 225a, 225b, and 225c the bit line program voltages ($V_{BLn}$) necessary for simultaneously programming each of the first charge trapping regions (BIT 1) 265a and 265b and the second charge trapping regions (BIT 2) 270a and 270b of the dual-sided charge-trapping nonvolatile memory cells 205a and 205b of the selected row. These levels are set based on the binary digital data to be stored as the trapped charge in the first and second charge trapping regions of the selected dual-sided flash memory cells.

To select the first charge trapping region (BIT 1) 265a and the second charge trapping region (BIT 2) 270a of the selected dual-sided charge-trapping nonvolatile memory cells 205a, the first top select gate line 240a and thus the gates of the top select transistors 216a, 217b, and 216c of the pairs of serially connected top select transistors 215a, 215b, and 215c are set to the second gate select voltage level ($V_{SG2}$) and the second top select gate line 240b and the second set of top select transistors 217a, 216b, and 217c of the pairs of serially connected top select transistors 215a, 215b, and 215c is set to the first select voltage level ($V_{SG1}$). This order of activation of the second gate select voltage level ($V_{SG2}$) on the first top select gate line 240a and the first gate select voltage level ($V_{SG1}$) on the second top select gate line 240b connects the first charge trapping region (BIT 1) 265a of the selected dual-sided charge-trapping nonvolatile memory cells 205a to the bit line 225a. The first bottom select gate line 245a and thus the gates of the bottom select transistors 256a, 257b, and 256c of the pairs of serially connected bottom select transistors 255a, 255b, and 255c are set to the second gate select voltage level ($V_{SG2}$) and the second bottom select gate line 245b and thus the second set of top select transistors 257a, 256b, and 257c of the pairs of serially connected bottom select transistors 255a, 255b, and 255c is set to the first select voltage level ($V_{SG1}$). This order of activation of the second gate select voltage level ($V_{SG2}$) on the first bottom select gate line 245a and the second gate select voltage level ($V_{SG2}$) on the second bottom select gate line 245b connects the second charge trapping region (BIT 2) 270a of the selected dual-sided charge-trapping nonvolatile memory cells 205a to the bit line 225b.

To select the first charge trapping region (BIT 1) 265b and the second charge trapping region (BIT 2) 270b of the selected dual-sided charge-trapping nonvolatile memory cells 205b, the first top select gate line 240a and thus the gates of the top select transistors 216a, 217b, and 216c of the pairs of serially connected top select transistors 215a, 215b, and 215c are set to the first gate select voltage level ($V_{SG1}$) and the second top select gate line 240b and the second set of top select transistors 217a, 216b, and 217c of the pairs of serially connected top select transistors 215a, 215b, and 215c is set to the second select voltage level ($V_{SG2}$). This order of activation of the first gate select voltage level ($V_{SG1}$) on the first top select gate line 240a and the second gate select voltage level ($V_{SG2}$) on the second top select gate line 240b connects the first charge trapping region (BIT 1) 265b of the selected dual-sided charge-trapping nonvolatile memory cells 205b to the bit line 225b. The first bottom select gate line 245a and thus the gates of the bottom select transistors 256a, 257b, and 256c of the pairs of serially connected bottom select transistors 255a, 255b, and 255c are set to the first gate select voltage level ($V_{SG1}$) and the second bottom select gate line 245b and thus the second set of top select transistors 257a, 256b, and 257c of the pairs of serially connected bottom select transistors 255a, 255b, and 255c is set to the second select voltage level ($V_{SG2}$). This order of activation of the second gate select voltage level ($V_{SG2}$) on the second bottom select gate line 245b and the second gate select voltage level ($V_{SG2}$) on the first bottom select gate line 245b connects the second charge trapping region (BIT 2) 270a of the selected dual-sided charge-trapping nonvolatile memory cells 205b to the bit line 225c.

As noted above the implants of the implanted transistors 217a, 217b, and 217c of the pairs of serially connected top select transistors 215a, 215b, and 215c and the implanted transistors 257a, 257b, and 257c of the pairs of serially connected bottom select transistors 255a, 255b, and 255c are implanted with either an acceptor impurity such as boron to adjust the threshold voltage ($V_{th}$) to a level of approximately +4.0V or a donor impurity such phosphorus to adjust the threshold voltage ($V_{th}$) to approximately −4.0V.

In the case of the implanted transistors 217a, 217b, and 217c of the pairs of serially connected top select transistors 215a, 215b, and 215c and the implanted transistors 257a, 257b, and 257c of the pairs of serially connected bottom select transistors 255a, 255b, and 255c with an acceptor impurity ($V_{th}$ more than +4.0V) in series with a regular enhancement non-implanted transistor 216a, 216b, and 216c and 256a, 256b, and 256c ($V_{th}$=+0.7V), the second gate select voltage level (VSG2) turns on only the non-implanted device 216a, 216b, and 216c and 256a, 256b, and 256c. The second gate select voltage level ($V_{SG2}$) is set to be in-between the threshold voltages of the non-implanted transistor 216a, 216b, and 216c and 256a, 256b, and 256c and the implanted transistors 217a, 217b, and 217c and the implanted transistors 257a, 257b, and 257c.

In the case of the implanted transistors 217a, 217b, and 217c of the pairs of serially connected top select transistors 215a, 215b, and 215c and the implanted transistors 257a, 257b, and 257c of the pairs of serially connected bottom select transistors 255a, 255b, and 255c with donor impurities ($V_{th}$<−2.0V or negative) in series with a regular enhancement non-implanted transistor 216a, 216b, and 216c and 256a, 256b, and 256c ($V_{th}$=+0.7V), the second gate select voltage level (VSG2) turns on only the implanted transistors 217a, 217b, and 217c of the pairs of serially connected top select transistors 215a, 215b, and 215c and the implanted transistors 257a, 257b, and 257c of the pairs of serially connected bottom select transistors 255a, 255b, and 255c. The second gate select voltage level ($V_{SG2}$) is again set to be in-between the threshold voltages of the non-implanted transistor 216a, 216b, and 216c and 256a, 256b, and 256c and the implanted transistors 217a, 217b, and 217c and the implanted transistors 257a, 257b, and 257c. The first gate select voltage level ($V_{SG1}$) in both case of types of implanted transistors is set large enough to turn on both of the pairs of serially connected top select transistors 215a, 215b, and 215c and pairs of serially connected bottom select transistors 255a, 255b, and 255c Table 3 provides the program voltage levels for the two implementations of the implanted transistor of the pairs of serially connected top select transistors 215a, 215b, and 215c.

TABLE 3

| Voltage Level | Donor Implant such as Phosphorus | Acceptor Implant such as Boron |
|---|---|---|
| VSG1 | ~+5.0 V to ~+10.0 V | ~+5.0 V to ~+7.0 V |
| VSG2 | ~+0 V to ~+2.0 V | ~+10.0 V to ~+15.0 V |
| VPGM | ~−6.0 V to ~−15.0 V | ~−6.0 V to ~−15.0 V |
| VPASS | ~+5.0 V to ~+10.0 V | ~+5.0 V to ~+10.0 V |
| VBL1,2,3 | ~+3.00 V to ~+5.0 V | ~+3.00 V to ~+5.0 V |

The voltage signals for the Erase and Read of the nonvolatile memory array 200 of dual-sided charge-trapping nonvolatile memory cells 205 of this invention is illustrated in FIG. 3 are shown in FIGS. 10b and 10c with the gate select voltage levels ($V_{SG1}$ and $V_{SG2}$) as shown in Table 3.

The operational signals for the dual sided program operation of the array of dual-sided charge-trapping nonvolatile memory cells 205 of FIG. 4 are identical to those of FIG. 2. The differences being the sequences of the gate select voltage levels ($V_{SG1}$ and $V_{SG2}$) to operate a selected columns of the NAND series string groupings 210a, 210b, and 210c. Similarly, the operational signals for the dual sided program operation of the array of dual-sided charge-trapping nonvolatile memory cells 205 of FIG. 5 are identical to those of FIG. 3. The differences being the sequences of the gate select voltage levels ($V_{SG1}$ and $V_{SG2}$) to operate selected columns of the NAND series string groupings 210a, 210b, and 210c.

Refer now to FIG. 11 for an overview of the construction of the nonvolatile memory array of dual-sided charge-trapping nonvolatile memory cells of this invention. Multiple dual-sided charge-trapping nonvolatile memory cells are provided (Box 700) and arranged (Box 705) into rows and columns. Groups of the dual-sided charge-trapping nonvolatile memory cells on each column of the nonvolatile memory array dual-sided charge-trapping nonvolatile memory cells of this invention are formed (Box 710) into NAND series strings of the dual-sided charge-trapping nonvolatile memory cells.

Pairs of serially connected select transistors are formed (Box 715). One transistor of each of the pairs of serially connected select transistors is implanted (Box 720) in the channel region to adjust the threshold voltage ($V_t$) of the implanted transistor. The implanted transistor is optionally implanted (Box 720) with an acceptor impurity such as boron to adjust the threshold voltage ($V_{th}$) to a level of approximately +4.0V. That is compared to the threshold voltage ($V_{th}$) level of approximately +0.7V of the standard NMOS transistor of the non-implanted transistor of the pairs of serially connected select transistors. Alternately, the implanted transistor is implanted (Box 720) with a donor impurity such phosphorus to adjust the threshold voltage ($V_{th}$) to approximately 4.0V, as compared with the threshold voltage ($V_{th}$) level of approximately +0.7V for the NMOS transistor of the non-implanted transistor. The non-implanted transistor and the implanted transistor each have a source/drain that is commonly connected to for the serially connected structure. It should be noted that the order of the non-implanted and the implanted transistor of the pairs of serially connected select transistors is reversed between adjacent columns of the groups of the dual-sided charge-trapping nonvolatile memory cells.

For the nonvolatile memory array of dual-sided charge-trapping nonvolatile memory cells of FIGS. 2 and 4, a bottom select transistor is formed (Box 730). For the structure of FIGS. 2 and 4, pairs of serially connected select transistors are pairs of serially connected top select transistors. The pairs of serially connected top select transistors and bottom select transistors are each connected (Box 735) to a one of the NAND series strings of the dual-sided charge-trapping nonvolatile memory cells. For the structure of FIGS. 3 and 5, pairs of serially connected select transistors are pairs of serially connected top select transistors and pairs of serially connected bottom select transistors. The pairs of serially connected top select transistors and pairs of serially connected bottom select transistors are each connected (Box 735) to a one of the NAND series strings of the dual-sided charge-trapping nonvolatile memory cells.

Each of the columns of the NAND series strings of the dual-sided charge-trapping nonvolatile memory cells is associated (Box 740) with a pair of bit lines. Each of the pair of associated bit lines may be associated with an adjacent column of the dual-sided charge-trapping nonvolatile memory cells. A source/drain of each of the top most select transistors of the pairs of serially connected top select transistors is connected (Box 745) to a first of the associated pair of bit lines and a source/drain of the bottom select transistor (for FIGS. 2 and 4) or bottom most select transistor of the pairs of serially connected top select transistors is connected (Box 745) to the second of the associated pair of bit lines. A bit line controller is connected (Box 750) to the associated pairs of bit lines for each of the columns of the nonvolatile memory array of this invention. A word line is associated with each row of the dual-sided charge-trapping nonvolatile memory cells. The dual-sided charge-trapping nonvolatile memory cells is then connected (Box 755) to control gates of each of the dual-sided charge-trapping nonvolatile memory cells on the associated row of the dual-sided charge-trapping nonvolatile memory cells. A word line controller is connected (Box 760) to each of the word lines and thus to control gates of the associated dual-sided charge-trapping nonvolatile memory cells.

The connection of the top select transistor of each grouping of the dual-sided charge-trapping nonvolatile memory cells to the first of the associated bit lines and the connection of the bottom select transistor (either the single bottom select transistor of FIGS. 2 and 4 or the bottom most select transistor of the pairs of serially connected bottom select transistors of FIGS. 3 and 5) to the second of the associated bit lines brings about the cross connective bit lines structure of the nonvolatile memory array of this invention.

While this invention has been particularly shown and described with reference to the preferred embodiments thereof, it will be understood by those skilled in the art that various changes in form and details may be made without departing from the spirit and scope of the invention.

The invention claimed is:

1. A nonvolatile memory structure comprising:
   a plurality of dual-sided charge-trapping nonvolatile memory cells connected in a NAND series string; and
   a pair of serially connected top select transistors,
      wherein each of the pair of serially connected top select transistors have a first source/drain and each of the first source/drains are connected together,
      wherein a first of the serially connected top select transistors has an implant to make a threshold voltage of the implanted first serially connected select transistor different from a non-implanted second serially connected top select transistor,
      wherein a second source/drain of one of the pair of serially connected transistors is connected to a top dual-sided charge-trapping nonvolatile memory cell of the NAND series string of dual-sided charge-trapping nonvolatile memory cells, and
      wherein a second source/drain of another of the serially connected transistors is connected to a first of two bit lines associated with the NAND series string nonvolatile memory structure; and wherein both of the pair of serially connected top select transistors are turned on only when a first select voltage applied to a gate of the one implanted transistor of the pair of serially connected top select transistors and a second select voltage applied to a gate of the other non-implanted pair of serially connected top select transistors are greater than the threshold voltages of the pair of serially connected top select transistors to connect the top dual-sided charge-trapping nonvolatile memory cell to the first of two bit lines with the NAND series string.

2. The nonvolatile memory structure of claim 1 further comprising a bottom select transistor having a first source/drain connected to a bottom dual-sided charge-trapping nonvolatile memory cell of the NAND series string of dual-sided charge-trapping nonvolatile memory cells and a second source/drain connected to a second of the two bit lines associated with the NAND series string nonvolatile memory structure.

3. The nonvolatile memory structure of claim 1 further comprising a pair of serially connected bottom select transistors, wherein each of the pair of serially connected bottom select transistors has a first source/drain and each of the first source/drains are connected together, wherein a first of the serially connected bottom select transistors has an implant to make a threshold voltage of the implanted first serially connected select transistor different from a second non-implanted serially connected bottom select transistor, wherein a second source/drain of one of the serially connected transistors is connected to a bottom dual-sided charge-trapping nonvolatile memory cell of the NAND series string of dual-sided charge-trapping nonvolatile memory cells, and wherein a second source/drain of another of the serially connected bottom transistors is connected to a second of the two bit lines associated with the NAND series string nonvolatile memory structure.

4. The nonvolatile memory structure of claim 3 wherein both of the pair of serially connected bottom select transistors are turned on only when a first select voltage applied to a gate of the one implanted transistor of the pair of serially connected bottom select transistors and a second select voltage applied to a gate of the other non-implanted pair of serially connected bottom select transistors are greater than the threshold voltages of the pair of serially connected bottom select transistors to connect the bottom dual-sided charge-trapping nonvolatile memory cell to the first of two bit lines with the NAND series string.

5. The nonvolatile memory structure of claim 1 wherein the implant is an acceptor impurity and adjusts the threshold voltage of the implanted one serially connected top select transistor to a larger positive voltage.

6. The nonvolatile memory structure of claim 5 wherein the acceptor impurity is boron.

7. The nonvolatile memory structure of claim 5 wherein the larger positive voltage is approximately +4.0V.

8. The nonvolatile memory structure of claim 1 wherein the implant is a donor impurity and adjusts the threshold voltage of the implanted one serially connected select transistor to a larger negative voltage.

9. The nonvolatile memory structure of claim 8 wherein the donor impurity is phosphorus.

10. The nonvolatile memory structure of claim 8 wherein the larger negative voltage is approximately −4.0V.

11. The nonvolatile memory structure of claim 3 wherein the implant is an acceptor impurity and adjusts the threshold voltage of the implanted one serially connected bottom select transistor to a larger positive voltage.

12. The nonvolatile memory structure of claim 11 wherein the acceptor impurity is boron.

13. The nonvolatile memory structure of claim 11 wherein the larger positive voltage is approximately +4.0V.

14. The nonvolatile memory structure of claim 3 wherein the implant is a donor impurity and adjusts the threshold voltage of the implanted one serially connected select transistor to a larger negative voltage.

15. The nonvolatile memory structure of claim 14 wherein the donor impurity is phosphorus.

16. The nonvolatile memory structure of claim 14 wherein the larger negative voltage is approximately −4.0V.

17. A nonvolatile memory array comprising:
a plurality of nonvolatile memory cells arranged in row and columns such that groups of the nonvolatile memory cells are serially connected to form NAND nonvolatile memory strings where each column includes at least one of the NAND nonvolatile memory strings, each of the NAND nonvolatile memory strings further comprising:
a pair of serially connected top select transistors,
wherein the pair of serially connected top select transistors each has a first source/drain with the two first source/drains of the pair of serially connected top select transistors being connected together,
wherein a first of the serially connected top select transistors has an implant to make a threshold voltage of the implanted first serially connected top select transistor different from a non-implanted second serially connected top select transistor,
wherein a second source/drain of one top select transistor of the pair of serially connected top select transistors is connected to a top dual-sided charge-trapping nonvolatile memory cell of the NAND series string of dual-sided charge-trapping nonvolatile memory cells,
wherein both of the pair of serially connected top select transistors are turned on only when a first select voltage applied to a gate of the one implanted transistor of the pair of serially connected top select transistors and a second select voltage applied to a gate of other non-implanted transistor of the serially connected top select transistors are greater than the threshold voltages pair of serially connected top select transistors to connect the top dual-sided charge-trapping nonvolatile memory cell to the first of two bit lines associated with the NAND series string nonvolatile memory structure; and
a plurality of bit lines, placed within the nonvolatile memory array such that each the bit lines is associated with at least one of the columns of the plurality of NAND nonvolatile memory strings and each of the columns of the plurality of NAND nonvolatile memory strings is associated with a pair of bit lines.
wherein a second source/drain of a top select transistor of the pair of serially connected top select transistors is connected to a first of the two bit lines associated with the NAND series string nonvolatile memory structure.

18. The nonvolatile memory array of claim 17 wherein each NAND nonvolatile memory string further comprises a bottom select transistor having a first source/drain connected to a bottom dual-sided charge-trapping nonvolatile memory cell of the NAND series string of dual-sided charge-trapping nonvolatile memory cells and a second source/drain connected to a second of the two bit lines associated with the NAND series string nonvolatile memory structure.

19. The nonvolatile memory array of claim 17 wherein each NAND nonvolatile memory string further comprises a pair of serially connected bottom select transistors,
wherein each of the pair of serially connected bottom select transistors has a first source/drain connected together;
wherein a first of the serially connected bottom select transistors has an implant to make a threshold voltage of the implanted first serially connected select transistor different from the other non-implanted serially connected bottom select transistor; and
wherein a second source/drain of one of the serially connected transistors is connected to a bottom dual-sided charge-trapping nonvolatile memory cell of the NAND series string of dual-sided charge-trapping nonvolatile memory cells.

20. The nonvolatile memory array of claim 17 wherein both of the pair of serially connected bottom select transistors are turned on only when a first select voltage applied to a gate of the one implanted transistor of the pair of serially connected bottom select transistors and a second select voltage applied to a gate of other non-implanted pair of serially connected bottom select transistors are greater than the threshold voltages pair of serially connected bottom select transistors to connect the bottom dual-sided charge-trapping nonvolatile memory cell to the second of two bit lines associated with the NAND series string nonvolatile memory structure.

21. The nonvolatile memory array of claim 17 wherein the implant is an acceptor impurity and adjusts the threshold voltage of the implanted one serially connected top select transistor to a larger positive voltage.

22. The nonvolatile memory array of claim 21 wherein the acceptor impurity is boron.

23. The nonvolatile memory array of claim 21 wherein the larger positive voltage is approximately +4.0V.

24. The nonvolatile memory array of claim 21 wherein the implant is a donor impurity and adjusts the threshold voltage of the implanted one serially connected top select transistor to a larger negative voltage.

25. The nonvolatile memory array of claim 19 wherein the implant is an acceptor impurity and adjusts the threshold voltage of the implanted one serially connected bottom select transistor to a larger positive voltage.

26. The nonvolatile memory array of claim 25 wherein the larger negative voltage is approximately +4.0V.

27. The nonvolatile memory array of claim 25 wherein the donor impurity is phosphorus.

28. The nonvolatile memory array of claim 25 wherein the acceptor impurity is boron.

29. The nonvolatile memory array of claim 25 wherein the larger positive voltage is approximately +4.0V.

30. The nonvolatile memory array of claim 19 wherein the implant is a donor impurity and adjusts the threshold voltage of the implanted one serially connected bottom select transistor to a larger negative voltage.

31. The nonvolatile memory array of claim 30 wherein the acceptor impurity is boron.

32. The nonvolatile memory array of claim 30 wherein the larger negative voltage is approximately +4.0V.

33. A method of forming a nonvolatile memory structure comprising the steps of:
forming a plurality of dual-sided charge-trapping nonvolatile memory cells;
connecting a plurality of dual-sided charge-trapping nonvolatile memory cells in a NAND series string;
forming a pair of serially connected top select transistors;
connecting together both first source/drain of the pair of serially connected top select transistors;
implanting a first of the serially connected top select transistors to make a threshold voltage of the implanted first serially connected select transistor different from a non-implanted second serially connected top select transistor;
connecting a second source/drain of one of the pair of serially connected transistors to a top dual-sided charge-trapping nonvolatile memory cell of the NAND series string of dual-sided charge-trapping nonvolatile memory cells; and
connecting a second source/drain of another of the serially connected transistors to a first of two bit lines associated with the NAND series string nonvolatile memory structure;
wherein both of the pair of serially connected top select transistors are turned on only when a first select voltage applied to a gate of the one implanted transistor of the pair of serially connected top select transistors and a second select voltage applied to a gate of the other non-implanted pair of serially connected top select transistors are greater than the threshold voltages of the pair of serially connected top select transistors to connect the top dual-sided charge-trapping nonvolatile memory cell to the first of two bit lines with the NAND series string.

34. The method of forming a nonvolatile memory structure of claim 33 further comprising the steps of:
forming a bottom select transistor;
connecting a first source/drain of the bottom select transistor to a bottom dual-sided charge-trapping nonvolatile memory cell of the NAND series string of dual-sided charge-trapping nonvolatile memory cells; and
connecting a second source/drain to a second of the two bit lines associated with the NAND series string nonvolatile memory structure.

35. The method of forming a nonvolatile memory structure of claim 33 further comprising the steps of:
forming a pair of serially connected bottom select transistors;
connecting together a first source/drain of each of the pair of serially connected bottom select transistors;
implanting a first of the serially connected bottom select transistors to make a threshold voltage of the implanted first serially connected select transistor different from a non-implanted second serially connected bottom select transistor;
connecting a second source/drain of one of the serially connected transistors to a bottom dual-sided charge-trapping nonvolatile memory cell of the NAND series string; and
connecting a second source/drain of another of the serially connected bottom transistors to a second of the two bit lines associated with the NAND series string.

36. The method of forming a nonvolatile memory structure of claim 35 wherein both of the pair of serially connected bottom select transistors are turned on only when a first select voltage applied to a gate of the one implanted transistor of the pair of serially connected bottom select transistors and a second select voltage applied to a gate of the other non-implanted pair of serially connected bottom select transistors are greater than the threshold voltages of the pair of serially connected bottom select transistors to connect the bottom dual-sided charge-trapping nonvolatile memory cell to the first of two bit lines with the NAND series string.

37. The method of forming a nonvolatile memory structure of claim 33 wherein implanting a first of the serially connected top select transistors comprises the step of implanting an acceptor impurity and adjusting the threshold voltage of the implanted one serially connected top select transistor to a larger positive voltage.

38. The method of forming a nonvolatile memory structure of claim 37 wherein the acceptor impurity is boron.

39. The method of forming a nonvolatile memory structure of claim 37 wherein the larger positive voltage is approximately +4.0V.

40. The method of a forming a nonvolatile memory structure of claim 33 wherein implanting a first of the serially connected top select transistors comprises the steps of implanting a donor impurity and adjusting the threshold voltage of the implanted one serially connected select transistor to a larger negative voltage.

41. The method of a forming a nonvolatile memory structure of claim 40 wherein the donor impurity is phosphorus.

42. The method of forming a nonvolatile memory structure of claim 40 wherein the larger negative voltage is approximately −4.0V.

43. The method of forming a nonvolatile memory structure of claim 35 wherein the implanting a first of the serially connected bottom select transistors comprises the step of implanting an acceptor impurity and adjusting the threshold voltage of the implanted one serially connected bottom select transistor to a larger positive voltage.

44. The method of forming a nonvolatile memory structure of claim 43 wherein the acceptor impurity is boron.

45. The method of forming a nonvolatile memory structure of claim 43 wherein the larger positive voltage is approximately +4.0V.

46. The method of forming a nonvolatile memory structure of claim 35 wherein implanting a first of the serially connected bottom select transistors comprises the step of implanting a donor impurity and adjusting the threshold voltage of the implanted one serially connected select transistor to a larger negative voltage.

47. The method of forming a nonvolatile memory structure of claim 46 wherein the donor impurity is phosphorus.

48. The method of forming a nonvolatile memory structure of claim 46 wherein the larger negative voltage is approximately −4.0V.

* * * * *